(12) United States Patent
Yamagami

(10) Patent No.: US 9,927,499 B2
(45) Date of Patent: Mar. 27, 2018

(54) SEMICONDUCTOR DEVICE

(71) Applicant: ROHM CO., LTD., Kyoto-shi, Kyoto (JP)

(72) Inventor: Mamoru Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/226,672

(22) Filed: Aug. 2, 2016

(65) Prior Publication Data

US 2017/0038438 A1    Feb. 9, 2017

(30) Foreign Application Priority Data

Aug. 7, 2015    (JP) ................................ 2015-157477

(51) Int. Cl.
| | |
|---|---|
| H01L 29/82 | (2006.01) |
| G01R 33/07 | (2006.01) |
| H01L 43/04 | (2006.01) |
| H01L 43/06 | (2006.01) |
| H01L 43/14 | (2006.01) |
| G01R 33/00 | (2006.01) |

(52) U.S. Cl.
CPC ......... *G01R 33/07* (2013.01); *G01R 33/0047* (2013.01); *G01R 33/0052* (2013.01); *H01L 43/04* (2013.01); *H01L 43/065* (2013.01); *H01L 43/14* (2013.01); *H01L 2224/97* (2013.01); *H01L 2924/15156* (2013.01)

(58) Field of Classification Search
CPC ......... G01R 33/07; H01L 43/04; H01L 43/06; H01L 43/065; H01L 43/14
See application file for complete search history.

(56) References Cited

U.S. PATENT DOCUMENTS

| | | | | |
|---|---|---|---|---|
| 5,453,727 A | * | 9/1995 | Shibasaki | ......... H01L 31/03046 257/E31.022 |
| 6,358,630 B1 | * | 3/2002 | Tsukada | ............... B23K 35/007 219/129 |
| 7,615,489 B1 | * | 11/2009 | Fu | ....................... H01L 21/2855 257/E21.575 |
| 2002/0008325 A1 | * | 1/2002 | Tominaga | ............... H01L 23/13 257/778 |
| 2004/0173810 A1 | * | 9/2004 | Lin | ....................... H01L 33/486 257/100 |
| 2005/0056445 A1 | * | 3/2005 | Orui | ..................... H05K 3/3452 174/535 |
| 2005/0253263 A1 | * | 11/2005 | Sugimoto | ........... H01L 21/4846 257/737 |

(Continued)

FOREIGN PATENT DOCUMENTS

JP    2002-368304 A    12/2002

*Primary Examiner* — Sitaramarao S Yechuri
(74) *Attorney, Agent, or Firm* — Hamre, Schumann, Mueller & Larson, P.C.

(57) ABSTRACT

A semiconductor device includes a semiconductor element, a semiconductor substrate including a substrate main surface and a recess that recedes from the substrate main surface and houses the semiconductor element, a conductive layer electrically connected to the semiconductor element and formed on the semiconductor substrate, a sealing resin covering the semiconductor element and including a resin main surface that faces in the same direction as the substrate main surface, and spherical conductors electrically connected to the conductive layer and protruding outward from the resin main surface.

22 Claims, 19 Drawing Sheets

(56) References Cited

U.S. PATENT DOCUMENTS

| | | | | |
|---|---|---|---|---|
| 2006/0255713 A1* | 11/2006 | Kondo | .................. | C09K 11/025 |
| | | | | 313/486 |
| 2010/0001305 A1* | 1/2010 | Lin | ......................... | H01L 24/82 |
| | | | | 257/99 |
| 2010/0072501 A1* | 3/2010 | Wakai | ..................... | H01L 33/20 |
| | | | | 257/98 |
| 2011/0158273 A1* | 6/2011 | Okayama | ................. | H01L 24/97 |
| | | | | 372/43.01 |
| 2014/0038323 A1* | 2/2014 | Tsang | .................... | H01L 33/642 |
| | | | | 438/26 |
| 2014/0048827 A1* | 2/2014 | Inoue | ..................... | H01L 33/08 |
| | | | | 257/88 |
| 2014/0187048 A1* | 7/2014 | Murakami | .......... | H01L 21/3065 |
| | | | | 438/703 |
| 2016/0148885 A1* | 5/2016 | Kawasaki | .............. | B23K 35/26 |
| | | | | 420/491 |
| 2016/0218021 A1* | 7/2016 | Appelt | ................ | H01L 23/3107 |

\* cited by examiner

SEMICONDUCTOR DEVICE

BACKGROUND OF THE INVENTION

1. Field of the Invention

The present invention relates to a semiconductor device and a manufacturing method of semiconductor devices. In particular, the invention relates to a semiconductor device, and its manufacturing method, that includes a microprocessed silicon substrate upon which a Hall-effect element is mounted.

2. Description of the Related Art

Recently, micromachines, or micro electro mechanical system (MEMS), have been widely used as applications of LSI manufacturing technologies. To prepare a micromachine, a silicon substrate may be subjected to microprocessing technique, and required semiconductor elements are mounted on the processed silicon substrate. In manufacturing the micromachine, for instance, anisotropic etching including wet etching with an alkaline solution is employed to implement the microprocessing of the substrate. By the anisotropic etching, minute recesses can be accurately formed on the silicon substrate, into which semiconductor elements are disposed.

For example, JP-A-No. 2002-368304 discloses a resin-packaged semiconductor device in which a Hall-effect element is mounted on a lead frame. In this semiconductor device, the Hall-effect element is located on the opposite side across the lead frame compared with a conventional device, by which the distance between the magneto-sensitive surface of the Hall-effect element and an external magnet to be located outside the semiconductor device is shortened compared with the conventional device, without changing the thickness of the package. Shortening the mentioned distance leads to improved sensitivity of the Hall-effect element with respect to the change of magnetic flux.

When the Hall-effect element is mounted in the micromachine as semiconductor element, the recess has to be made deeper so as to shorten the distance between the Hall-effect element and the magnet, in order to improve the sensitivity of the Hall-effect element. This is because the Hall-effect element is mounted on the bottom surface of the recess, and hence when the micromachine is implemented on the surface of e.g. an external circuit board, the magnet is located close to the bottom surface, outside the micromachine. In the anisotropic etching process for forming the recess, a certain area of the bottom surface has to be secured to allow the Hall-effect element to be mounted thereon. The side faces of the recess are inclined with respect to the bottom surface, and therefore securing the certain area for the bottom surface leads to an increase in plane projection area of the recess, which in turn results in an increase in size of the micromachine as a whole.

SUMMARY OF THE INVENTION

In view of the foregoing situation, the present invention has been proposed to provide a semiconductor device configured to improve the sensitivity of a Hall-effect element without incurring an increase in size of the entire device.

According to an aspect of the present invention, there is provided a semiconductor device that includes a semiconductor element, a semiconductor substrate, a conductive layer, a sealing resin and a plurality of spherical conductors. The semiconductor substrate has a substrate main surface and is formed with a recess that recedes from the substrate main surface and houses the semiconductor element. The conductive layer is electrically connected to the semiconductor element and formed on the semiconductor substrate. The sealing resin covers the semiconductor element and has a resin main surface that faces in the same direction as the substrate main surface. The spherical conductors are electrically connected to the conductive layer and protrude outward from the resin main surface.

Other features and advantages of the present invention will become more apparent from the detailed description give below with reference to the accompanying drawings.

DETAILED DESCRIPTION OF THE PREFERRED EMBODIMENTS

Embodiments of the present invention will be described below with reference to the accompanying drawings.

First Embodiment

Referring to FIG. 1 to FIG. 5, a semiconductor device A10 according to a first embodiment of the present invention will be described. For the convenience of description, a left-right direction in plan view will be referred to as first direction X, and an up-down direction perpendicular to the first direction X will be referred to as second direction Y. The first direction X and the second direction Y are both perpendicular to a thickness direction Z of the semiconductor device A10 (or substrate 1).

Figure 1:
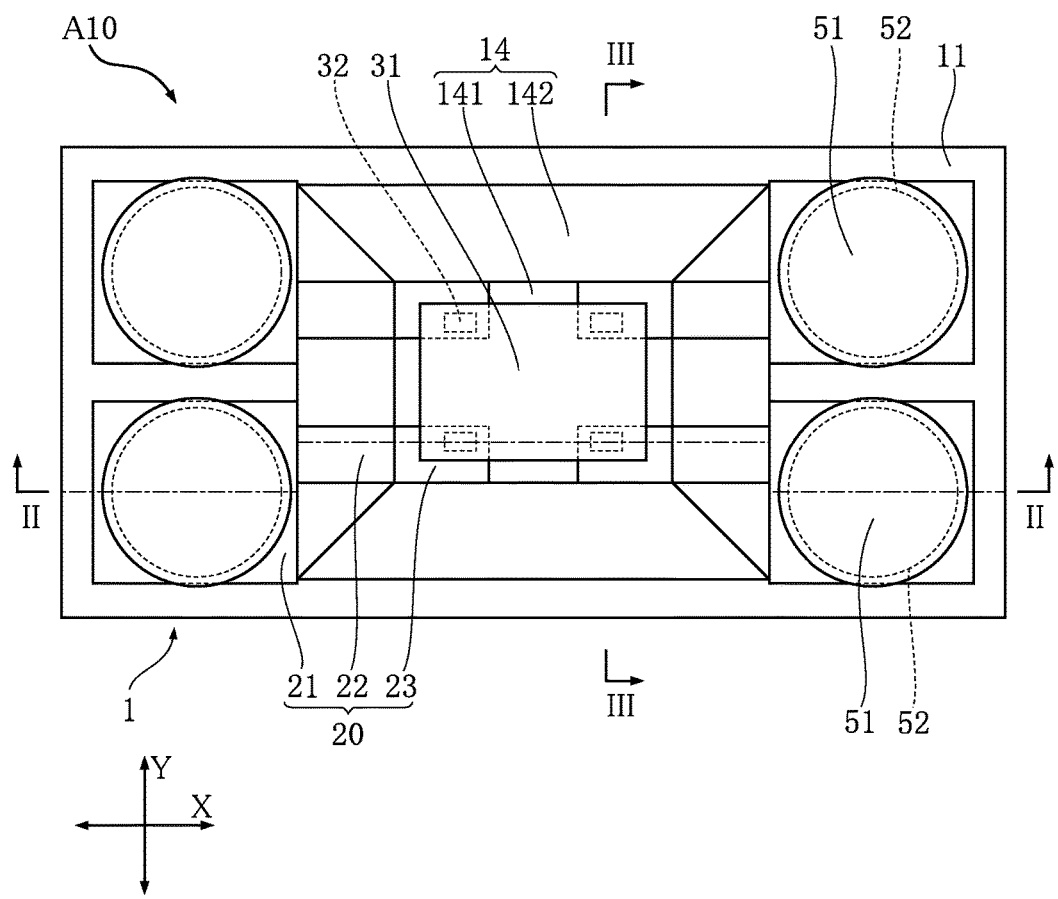
FIG. 1 is a plan view showing a semiconductor device according to a first embodiment of the present invention.
Figure 2:
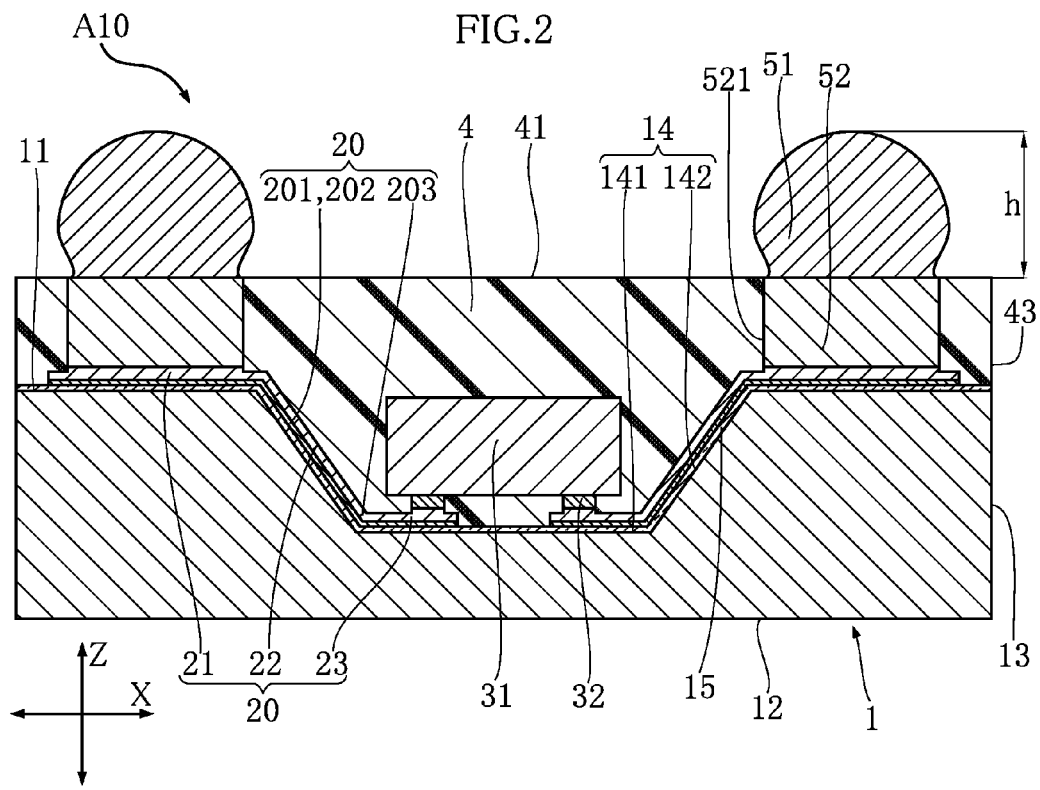
FIG. 2 is a cross-sectional view taken along a line II-II in FIG. 1.
Figure 3:
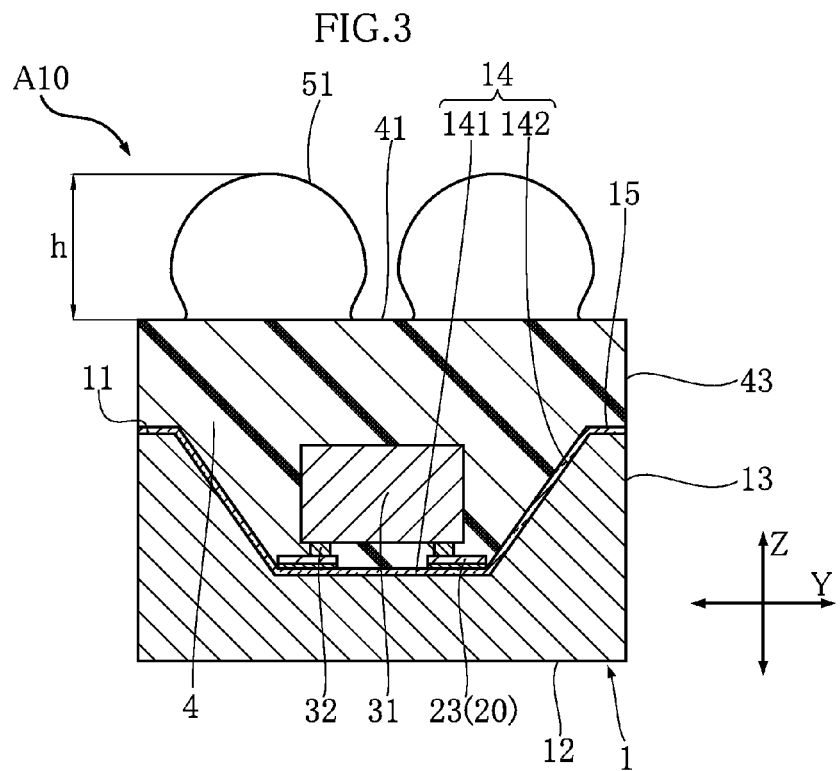
FIG. 3 is a cross-sectional view taken along a line III-III in FIG. 1.
Figure 4:
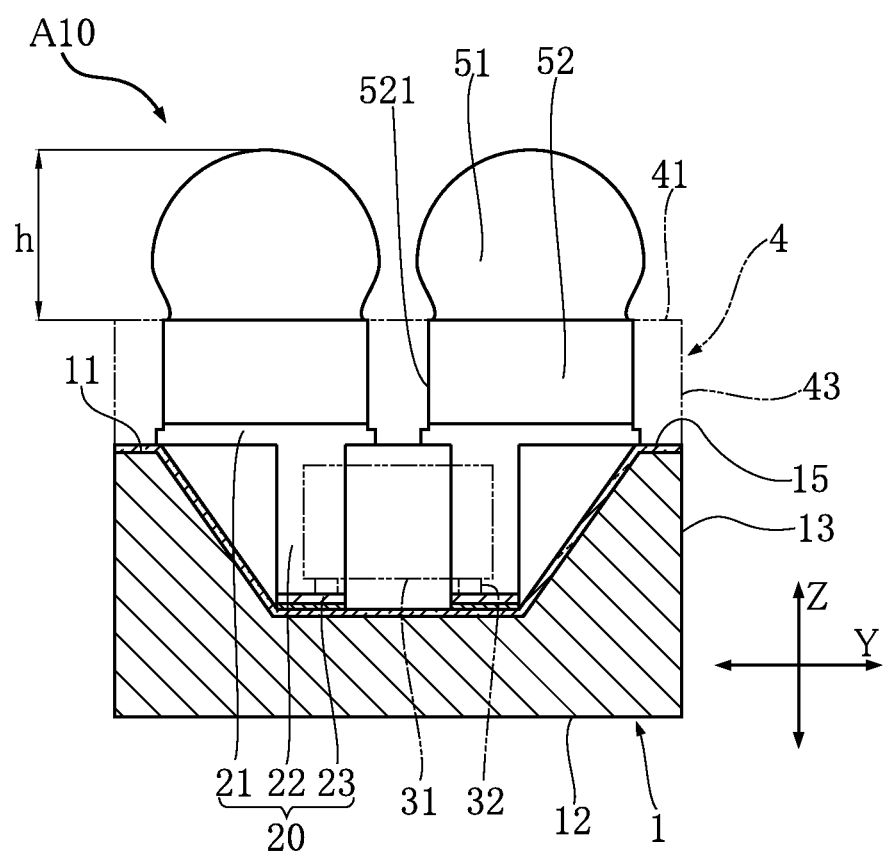
FIG. 4 is a cross-sectional view corresponding to FIG. 3.
Figure 5:
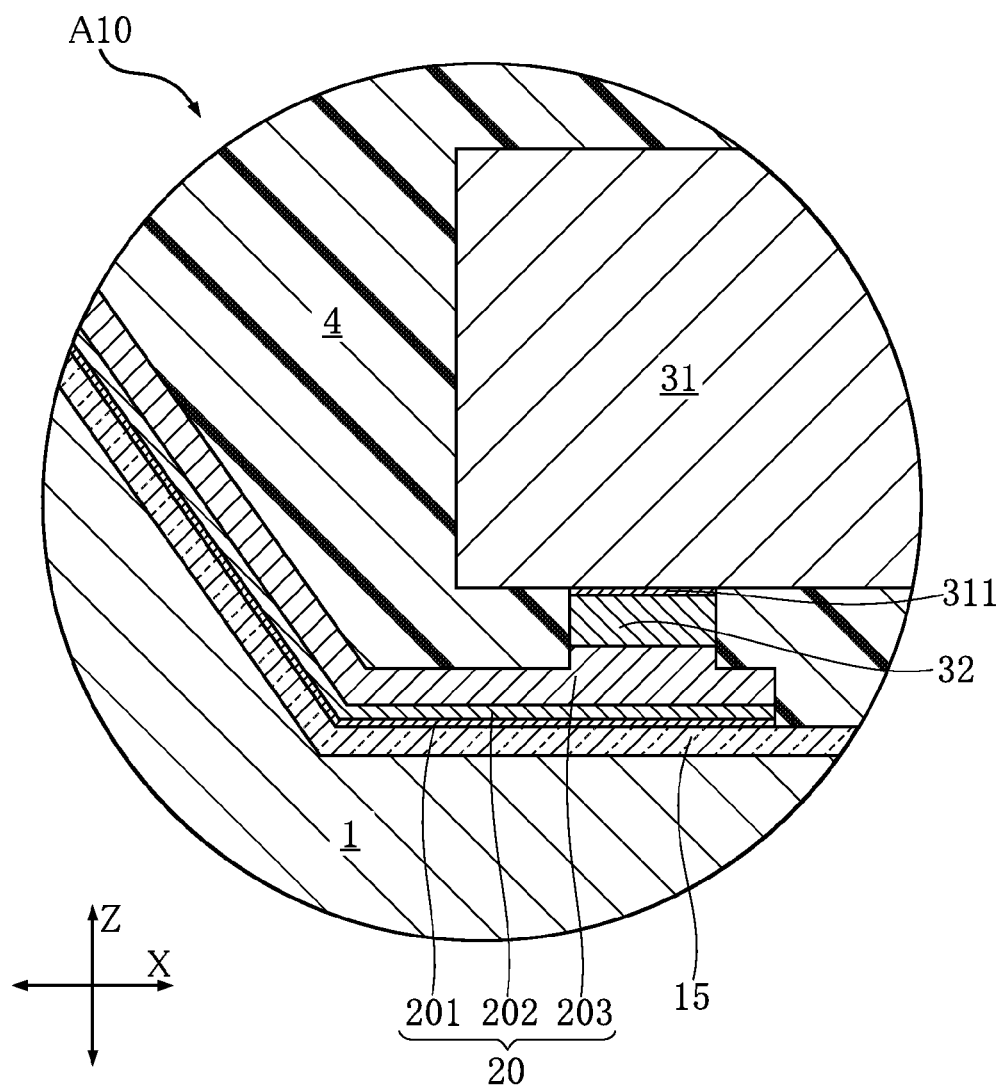
FIG. 5 is an enlarged fragmentary cross-sectional view of a portion in FIG. 2.

FIG. 1 is a plan view showing a part of the semiconductor device A10. FIG. 2 is a cross-sectional view taken along a line II-II (chain line) in FIG. 1. FIG. 3 is a cross-sectional view taken along a line III-III in FIG. 1. FIG. 4 is a cross-sectional view corresponding to FIG. 3, with a semiconductor element 31, a bonding layer 32 and a sealing resin 4 depicted in double-dot chain lines. FIG. 5 is an enlarged fragmentary cross-sectional view of a portion in FIG. 2. For clarity, an insulation layer 15 and the sealing resin 4 are omitted from FIG. 1.

The semiconductor device A10 according to this embodiment includes a substrate 1, an insulation layer 15, a conductive layer 20, a semiconductor element 31, a bonding layer 32, a sealing resin 4, a plurality of spherical conductors 51 and a plurality of columnar conductors 52. In this embodiment, the semiconductor device A10 is a magnetic sensor mounted on the surface of e.g. a circuit board of an external electronic apparatus. In this embodiment, the semiconductor device A10 has a rectangular shape in plan view (as viewed in the thickness direction Z of the substrate 1).

The substrate 1, with the semiconductor element 31 mounted thereon, serves as base of the semiconductor device A10. The substrate 1 is made of a monocrystalline semiconductor material such as monocrystalline Si. In this embodiment the substrate 1 has a thickness of 200 to 350 µm. As shown in FIG. 1, the substrate 1 has a rectangular shape in plan view. The substrate 1 includes a main surface 11, a back surface 12, side faces 13, and a recess 14.

The main surface 11 corresponds to the upper surface of the substrate 1 shown in FIG. 2 and FIG. 3. In this embodiment, the plurality of spherical conductors 51 and the columnar conductors 52 are formed on the main surface 11, and hence the semiconductor device A10 is surface-mounted on e.g. an external circuit board with the main surface 11 facing the external circuit board. The back surface 12 corresponds to the bottom surface of the substrate 1 shown in FIG. 2 and FIG. 3. When the semiconductor device A10 is mounted on the circuit board, the back surface 12 is oriented upward. As is apparent from FIG. 2 and FIG. 3, the main surface 11 and the back surface 12 are both orthogonal to the thickness direction Z of the substrate 1. The main surface 11 and the back surface 12 are oriented in opposite directions in the thickness direction Z. The main surface 11 and the back surface 12 are both flat. In this embodiment, the main surface 11 is a (100) surface. Further, as shown in FIG. 1 and FIG. 2, in this embodiment the substrate 1 includes a recess 14 formed so as to recede from the main surface 11. Because of the presence of the recess 14, the main surface 11 is formed in a frame shape surrounding the recess 14 in plan view, as shown in FIG. 1.

As shown in FIG. 2 and FIG. 3, the side faces 13 include four faces extending between the main surface 11 and the back surface 12 and oriented outward in the first direction X and in the second direction Y. In this embodiment, the side faces 13 are all flat, and orthogonal to the main surface 11 and the back surface 12.

As shown in FIG. 1 to FIG. 3, the recess 14 is formed so as to recede from the main surface 11, so as to allow the semiconductor element 31 to be mounted therein. The recess 14 is not formed all the way through the substrate 1 in the thickness direction Z. The recess 14 includes a bottom surface 141 and an intermediate surface 142. The bottom surface 141 includes a region where the semiconductor element 31 is to be mounted. In this embodiment, the bottom surface 141 is flat and orthogonal to the thickness direction Z of the substrate 1. The bottom surface 141 has a rectangular shape in plan view.

As shown in FIG. 1 to FIG. 3, the intermediate surface 142 is connected to the bottom surface 141 and the main surface 11. In the thickness direction Z of the substrate 1, the lower end of the intermediate surface 142 shown in FIG. 2 and FIG. 3 is connected to the bottom surface 141, and the upper end of the intermediate surface 142 shown in FIG. 2 and FIG. 3 is connected to the main surface 11. The intermediate surface 142 is inclined with respect to the bottom surface 141. In this embodiment, the intermediate surface 142 includes a plurality of (four) surfaces. The plurality of intermediate surfaces 142 are formed along the four sides of the bottom surface 141. The intermediate surfaces 142 are inclined with respect to the bottom surface 141 at the same angle, which is 54.74°.

The insulation layer 15 is an electrically insulative layer formed so as to cover the substrate 1 including the recess 14, that is, the entirety of the main surface 11, the bottom surface 141, and the intermediate surface 142 as shown in FIG. 2, FIG. 3, and FIG. 5. The insulation layer 15 is disposed between the substrate 1 and the conductive layer 20. In this embodiment, the insulation layer 15 is made of $SiO_2$, in a thickness of 1 to 2 µm. Since the substrate 1 is made of the semiconductor material and the conductive layer 20 is formed on the substrate 1 as shown in FIG. 1, the region of the substrate 1 where the conductive layer 20 is to be formed needs to be electrically insulated.

The conductive layer 20 constitutes, in collaboration with the plurality of spherical conductors 51 and the columnar conductors 52, a conduction path between the semiconductor device A10 and an external circuit board. As shown in FIG. 1, the conductive layer 20 is formed along the main surface 11, the bottom surface 141, and the plurality of intermediate surfaces 142 of the substrate 1. In addition, as shown in FIG. 2, FIG. 3, and FIG. 5, the conductive layer 20 is electrically connected to the semiconductor element 31 via the bonding layer 32.

As shown in FIG. 2 and FIG. 5, the conductive layer 20 is formed in contact with the insulation layer 15, and includes a barrier layer 201, a seed layer 202, and a plated layer 203 stacked on each other. As shown in FIG. 5, the barrier layer 201 formed in contact with the insulation layer 15 is located closest to the substrate 1. The seed layer 202 is disposed between the barrier layer 201 and the plated layer 203. In this embodiment, the barrier layer 201 is made of Ti, in a thickness of 10 to 30 nm. The seed layer 202 and the plated layer 203 are both made of Cu, and the barrier layer 201 serves to prevent diffusion of Cu to the insulation layer 15. In this embodiment, the seed layer 202 has a thickness of 200 to 300 nm, and the plated layer 203 has a thickness of 3 to 10 μm. The plated layer 203 is thicker than the seed layer 202.

The conductive layer 20 includes a main surface conductive portion 21, an intermediate surface conductive portion 22, and a bottom surface conductive portion 23.

As shown in FIG. 1, the main surface conductive portion 21 is a rectangular portion in plan view, formed on the main surface 11. In this embodiment, the main surface conductive portion 21 is formed along the intersection between the main surface 11 and the intermediate surface 142. The main surface conductive portion 21 is connected to the intermediate surface conductive portion 22 at the intersection. The main surface conductive portion 21 includes a plurality of portions and, as shown in FIG. 2 and FIG. 4, the columnar conductors 52 are each formed on the main surface conductive portion 21.

As shown in FIG. 1 and FIG. 4, the intermediate surface conductive portion 22 is a strip-shaped portion in plan view, formed on a pair of surfaces of the intermediate surface 142 spaced from each other in the first direction X, out of the plurality of surfaces of the intermediate surface 142. The intermediate surface conductive portion 22 includes a plurality of portions, all of which are disposed parallel to the first direction X. In addition, as shown in FIG. 2, in the thickness direction Z of the substrate 1 the lower end of the intermediate surface conductive portion 22 is connected to the bottom surface conductive portion 23, and the upper end of the intermediate surface conductive portion 22 is connected to the main surface conductive portion 21.

As shown in FIG. 1, the bottom surface conductive portion 23 is a strip-shaped portion in plan view, formed on the bottom surface 141. As shown in FIG. 1 and FIG. 4, in this embodiment the bottom surface conductive portion 23 extends inwardly of the bottom surface 141, along the intersection between the bottom surface 141 and the region of the intermediate surface 142 where the intermediate surface conductive portion 22 is not formed. The bottom surface conductive portion 23 includes a plurality of portions, all of which are disposed parallel to the first direction X. The bottom surface conductive portion 23 is connected to the intermediate surface conductive portion 22 via an end portion close to the region of the intermediate surface 142 where the intermediate surface conductive portion 22 is formed. Further, as shown in FIG. 2 and FIG. 3, the semiconductor element 31 is mounted on the bottom surface conductive portion 23.

It should be noted that the arrangement of the conductive layer 20 shown in FIG. 1 is merely exemplary, and different arrangements may be adopted in manufacturing the semiconductor device A10.

The semiconductor element 31 is, as shown in FIG. 1 to FIG. 3, mounted on the conductive layer 20, more specifically on the bottom surface conductive portion 23, via the bonding layer 32. In this embodiment, the semiconductor element 31 is a Hall-effect element, and thus the semiconductor device A10 may serve as a magnetic sensor. In this embodiment, in addition, the Hall-effect element is of a GaAs type. The GaAs Hall-effect element is excellent in linearity of the hall voltage with respect to the change of magnetic flux, and insusceptible to temperature change. A non-illustrated magneto-sensitive surface, for detecting the change of magnetic flux caused by a magnet located outside the semiconductor device A10, is formed on the lower surface of the semiconductor element 31 shown in FIG. 2 and FIG. 3. The semiconductor element 31 includes electrode bumps 311 (see FIG. 5).

The electrode bump 311 depicted in FIG. 5 is a rectangular region in plan view, formed on the lower surface of the semiconductor element 31. The electrode bump 311 is, for example, made of Al. The electrode bump 311 is formed in contact with the bonding layer 32.

The bonding layer 32 is a conductive member disposed between the electrode bump 311 and the bottom surface conductive portion 23 of the conductive layer 20, as shown in FIG. 2, FIG. 3, and FIG. 5. In this embodiment, the bonding layer 32 is made up of a Ni layer and a Sn-containing alloy layer stacked on each other. Examples of the alloy layer may be a lead-free solder such as an Sn—Sb alloy and an Sn—Ag alloy. The semiconductor element 31 is bonded onto the bottom surface conductive portion 23 by the bonding layer 32, so that the electrical conduction between the semiconductor element 31 and the bottom surface conductive portion 23 can be secured.

The sealing resin 4 is, for example, made of an electrically insulative black epoxy resin. The sealing resin 4 is, as shown in FIG. 2 and FIG. 3, filled in the recess 14 so as to cover the main surface 11 except the region where the plurality of columnar conductors 52 are formed. In addition, the sealing resin 4 covers the semiconductor element 31. The sealing resin 4 includes a main surface 41 and side faces 43. The main surface 41 and the side faces 43 are exposed.

As shown in FIG. 2 and FIG. 3, the main surface 41 is a flat surface oriented in the same direction as the main surface 11. The respective upper surfaces of the plurality of columnar conductors 52 are exposed from the main surface 41. The side faces 43 include four surfaces extending between the main surface 41 and the insulation layer 15, and oriented outward in the first direction X and in the second direction Y. The side faces 43 are all flat, and flush with the respective side faces 13 of the substrate 1.

The plurality of spherical conductors 51 are formed so as to protrude outward from the main surface 41 as shown in FIG. 2 and FIG. 4, to be used when the semiconductor device A10 is surface-mounted on a circuit board. The spherical conductors 51 are electrically conductive, and, in this embodiment, electrically connected to the conductive layer 20 formed on the main surface 11, more specifically to the main surface conductive portion 21, via the columnar conductor 52. The surface layer of the spherical conductor 51 is an alloy layer containing Sn such as a lead-free solder as noted above with the bonding layer 32. In this embodiment, the internal portion of the spherical conductor 51 may include a spherical core made of Cu and a Ni layer covering the core. The spherical conductor 51 thus configured may be provided by a Cu-core solder ball. In this embodiment, the height h from the main surface 41 to the top of the spherical conductor 51 is 150 to 200 μm, for example.

The plurality of columnar conductors 52 are, as shown in FIG. 1, FIG. 2, and FIG. 4, electrically conductive members disposed between the main surface conductive portion 21 and the spherical conductor 51. One end of the columnar conductor 52, the lower end of the columnar conductor 52 shown in FIG. 2, is in contact with the region of the conductive layer 20 corresponding to the main surface 11, that is, the main surface conductive portion 21, while the other end, i.e., the upper end of the columnar conductor 52 shown in FIG. 2, is in contact with the spherical conductor 51. Because of the presence of the plurality of columnar conductors 52, electrical conduction is secured between the main surface conductive portions 21 and the spherical conductors 51. In this embodiment, the columnar conductor 52 has a circular column shape, and the side face 521 thereof is covered with the sealing resin 4. In this embodiment, the columnar conductor 52 may be made of Cu, for example.

Referring now to FIG. 6 to FIG. 23, a manufacturing method of the semiconductor device A10 will be described hereunder. FIGS. 6-9 and 11-22 cross-sectional views for explaining processes in the manufacturing method of the semiconductor device A10, the cross-sectional views corresponding to the cross-sectional view of FIG. 2. FIG. 10 is a perspective view showing a substrate 81 obtained after the process shown in FIG. 9. FIG. 23 is a plan view showing a process in the manufacturing method of the semiconductor device A10.

Figure 6:
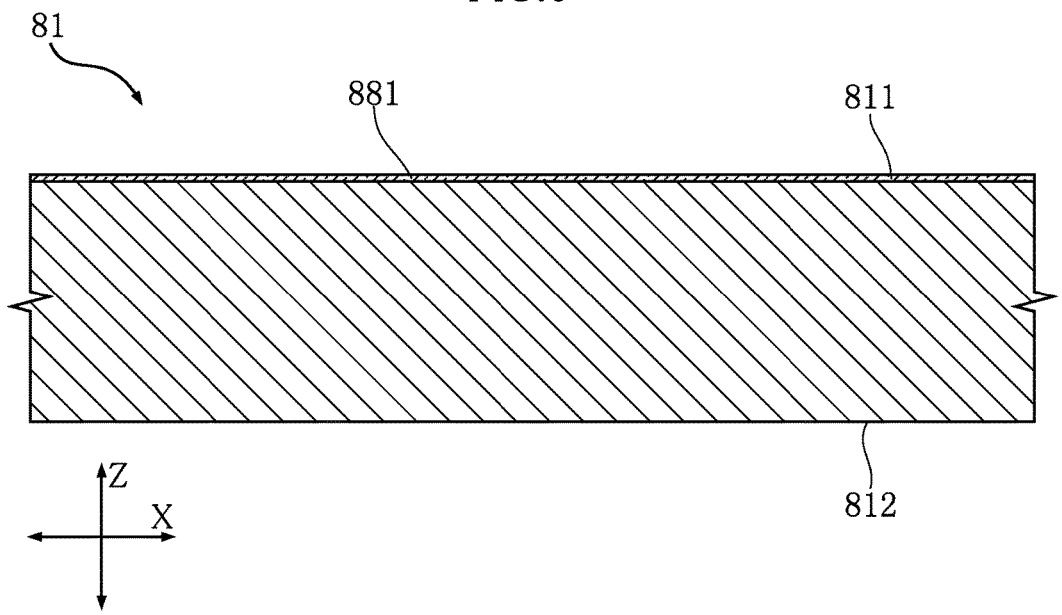
FIG. 6 is a cross-sectional view showing a process in a manufacturing method of the semiconductor device shown in FIG. 1.

Referring first to FIG. 6, a substrate 81 is prepared. The substrate 81 is an aggregation of the substrates 1 of the semiconductor device A10. The substrate 81 is made of a monocrystalline semiconductor material such as monocrystalline Si. In this embodiment, the substrate 81 has a thickness of 200 to 350 μm. The substrate 81 has a main surface 811, a back surface 812, and formed with a mask layer 881. The main surface 811 corresponds to the upper surface of the substrate 81 shown in FIG. 6. The back surface 812 corresponds to the lower surface of the substrate 81 shown in FIG. 6. The main surface 811 and the back surface 812 face in opposite directions in the thickness direction Z of the substrate 81. The main surface 811 and the back surface 812 are both flat. In this embodiment, the main surface 811 is a (100) surface. The mask layer 881 is formed on the main surface 811 and, for example, made of $Si_3N_4$. The mask layer 881 may be formed by a plasma CVD process.

Figure 7:
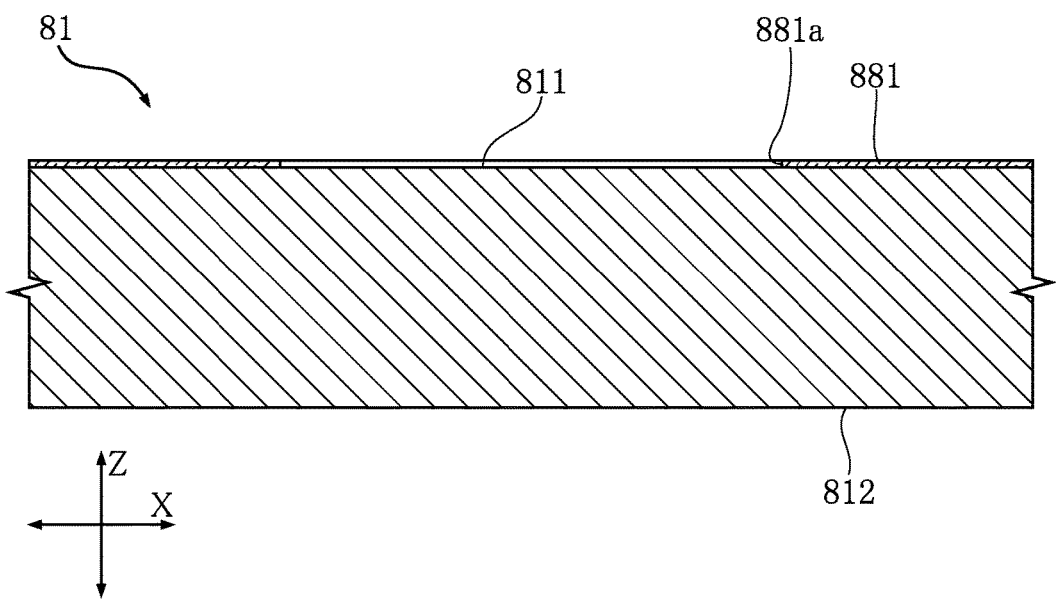
FIG. 7 is a cross-sectional view showing a process in the manufacturing method of the semiconductor device shown in FIG. 1.

Referring to FIG. 7, a mask (not shown) is formed over the mask layer 881 by photolithography, and then the mask layer 881 is partially removed by reactive ion etching (RIE), a known example of dry etching. When the mask layer 881 is made of $Si_3N_4$, $CF_4$ is employed as the etching gas. Through the etching, a plurality of openings 881a spaced from each other in the first direction X and the second direction Y are formed in the mask layer 881 (only one opening 881a is shown in FIG. 7). In each of the plurality of openings 881a, the main surface 811 is exposed. The plurality of openings 881a each have a rectangular shape in plan view.

Figure 8:
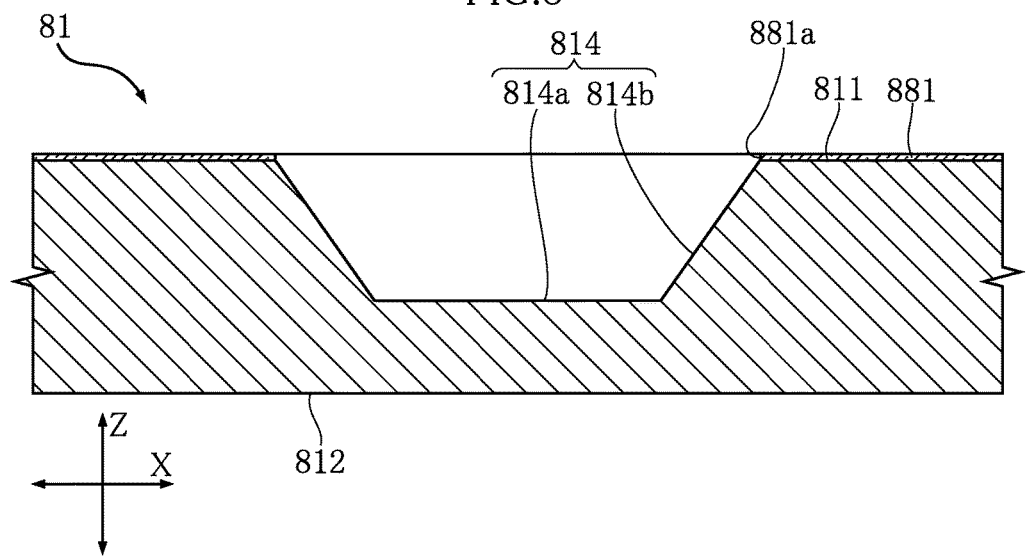
FIG. 8 is a cross-sectional view showing a process in the manufacturing method of the semiconductor device shown in FIG. 1.

Referring to FIG. 8, a plurality of recesses 814 are formed on the substrate 81 so as to recede from the main surface 811. The recesses 814 each correspond to the recess 14 of the semiconductor device A10. The recess 814 may be formed by anisotropic etching. In this embodiment, the anisotropic etching is a wet etching process that utilizes an alkaline solution. The alkaline solution may be, for example, a potassium hydroxide (KOH) solution or a tetramethyl ammonium hydroxide (TMAH) solution. Through the mentioned process, the recess 814 including a bottom surface 814a and an intermediate surface 814b connected to the main surface 811 and the bottom surface 814a is formed in each of the plurality of openings 881a formed in the mask layer 881. In this embodiment, the bottom surface 814a has a rectangular shape in plan view. The intermediate surface 814b includes a plurality of (four) surfaces respectively formed along the four sides of the bottom surface 814a. In this embodiment, since the main surface 811 is a (100) surface, the plurality of surfaces of the intermediate surface 814b are each a (111) surface. Thus, the respective intermediate surfaces 814b will be inclined with respect to the bottom surface 814a at the same angle, which is 54.74°.

Figure 9:
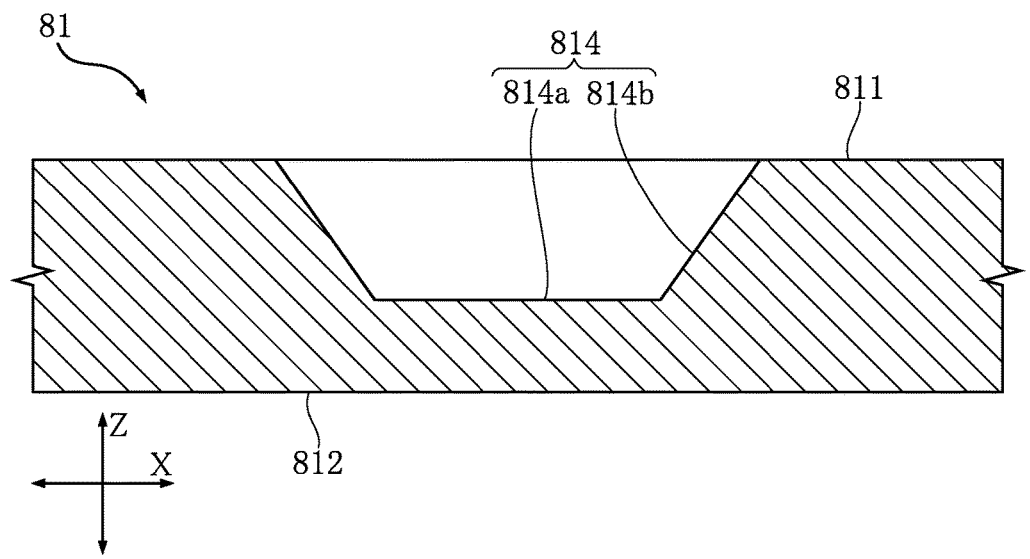
FIG. 9 is a cross-sectional view showing a process in the manufacturing method of the semiconductor device shown in FIG. 1.
Figure 10:
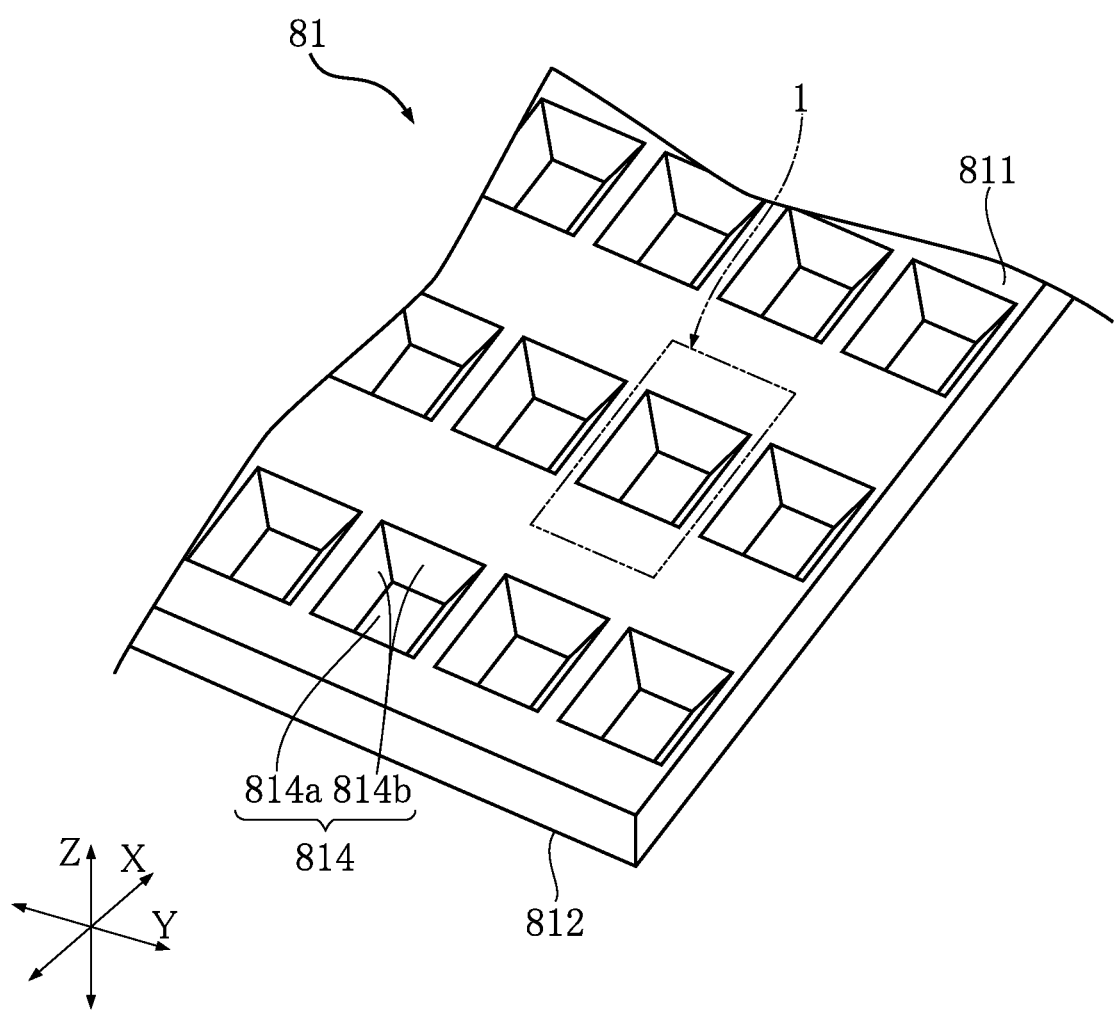
FIG. 10 is a perspective view showing a substrate obtained after the process shown in FIG. 9.

Referring to FIG. 9, the mask layer 881 remaining on the main surface 811 is thoroughly removed, by reactive ion etching utilizing $CF_4$ as etching gas, or wet etching utilizing heated solution of phosphoric acid, when the mask layer 881 is made of $Si_3N_4$ as in this embodiment. FIG. 10 is a perspective view of the substrate 81 from which the mask layer 881 has been thoroughly removed. As shown in FIG. 10, a plurality of recesses 814 spaced from each other in the first direction X and the second direction Y are formed in the substrate 81 so as to recede from the main surface 811. A region on the substrate 81 corresponding to the substrate 1 of the semiconductor device A10 is indicated by double-dot chain lines in FIG. 10.

Figure 11:
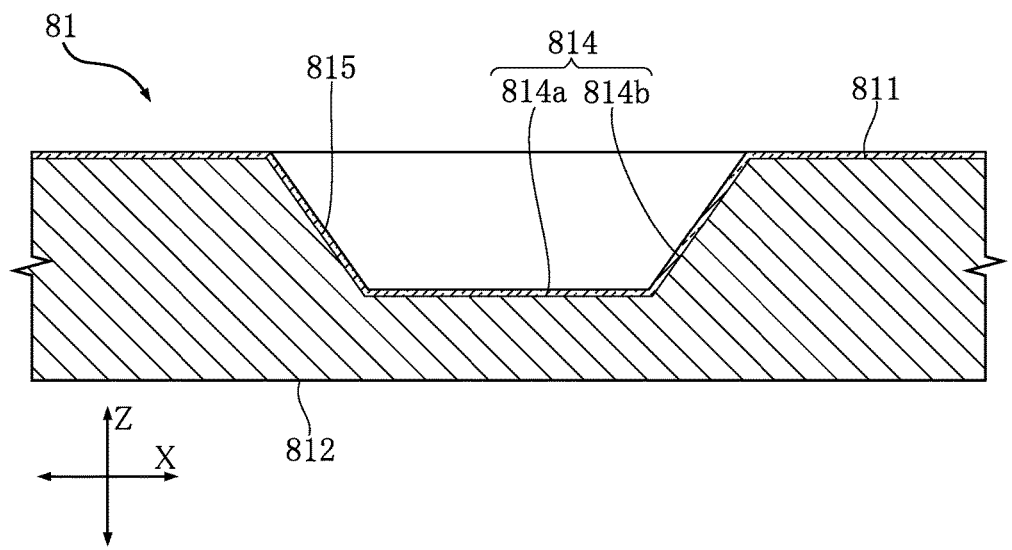
FIG. 11 is a cross-sectional view showing a process in the manufacturing method of the semiconductor device shown in FIG. 1.

Proceeding to FIG. 11, an insulation layer 815 is formed on the substrate 81 including the recesses 814. The insulation layer 815 corresponds to the insulation layer 15 of the semiconductor device A10. In this embodiment the insulation layer 815 is made of $SiO_2$, in a thickness of 1 to 2 μm. The insulation layer 815 may be formed by thermal oxidation of not only the main surface 811 but also the bottom surface 814a and the intermediate surface 814b constituting the recess 814.

Then a conductive layer 82 is formed on the substrate 81 including the recess 814. The process to form the conductive layer 82 includes forming a barrier layer 821, a seed layer 822, and a plated layer 823.

Figure 12:
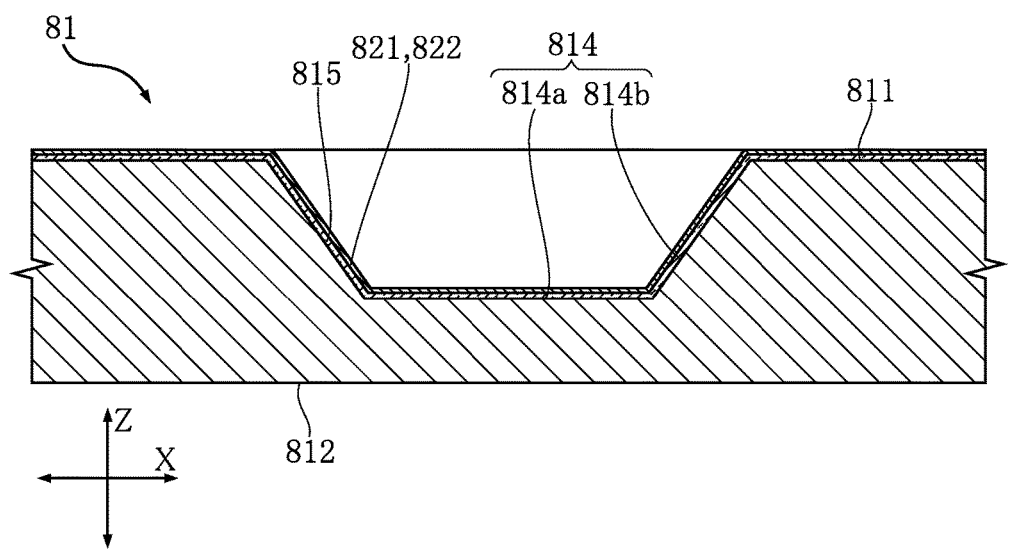
FIG. 12 is a cross-sectional view showing a process in the manufacturing method of the semiconductor device shown in FIG. 1.

First, as shown in FIG. 12, the barrier layer 821 and the seed layer 822 are formed on the substrate 81. The barrier layer 821 and the seed layer 822 are formed over the same region where the insulation layer 815 has been formed. The barrier layer 821 contacting the insulation layer 815 is formed first, and then the seed layer 822 is formed in contact with the barrier layer 821. The barrier layer 821 and the seed layer 822 are both formed by sputtering. In this embodiment, the barrier layer 821 is made of Ti in a thickness of 10 to 30 nm. The seed layer 822 is made of Cu, in a thickness of 200 to 300 nm.

Figure 13:
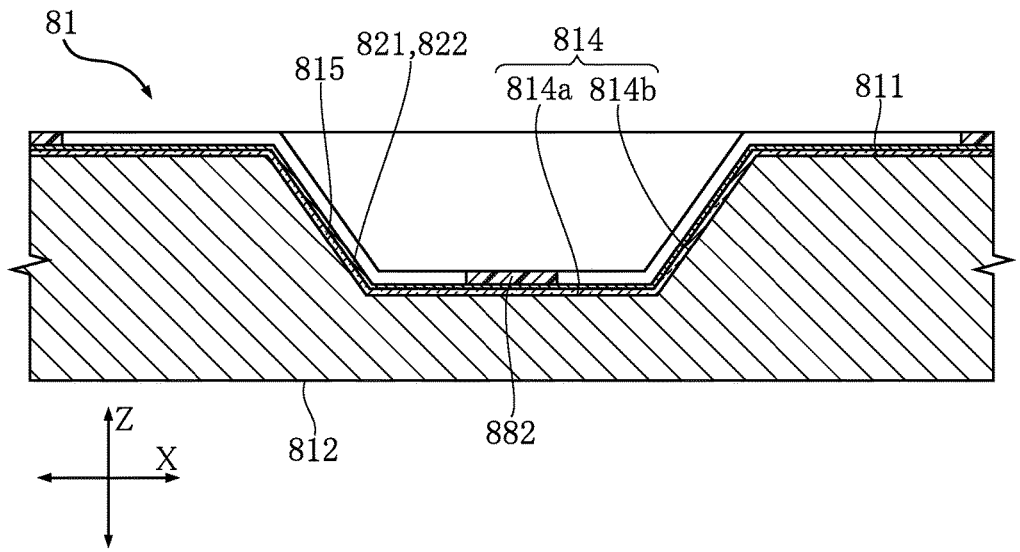
FIG. 13 is a cross-sectional view showing a process in the manufacturing method of the semiconductor device shown in FIG. 1.

Then, as shown in FIG. 13, a first resist layer or mask 882 is formed over the seed layer 822 by photolithography. Specifically, first, a base resist layer is formed on the substrate 81 by spraying a resist material over the seed layer 822 (the sprayed region corresponds to the region where the insulation layer 815 is formed). Then, the base resist layer is exposed to light in a predetermined patter. Since the resist material is of a positive type, the light-exposed portions of the base resist layer are removed by a developing solution used in the subsequent developing process. Thus, the first resist layer 882 shown in FIG. 13 is obtained.

Figure 14:
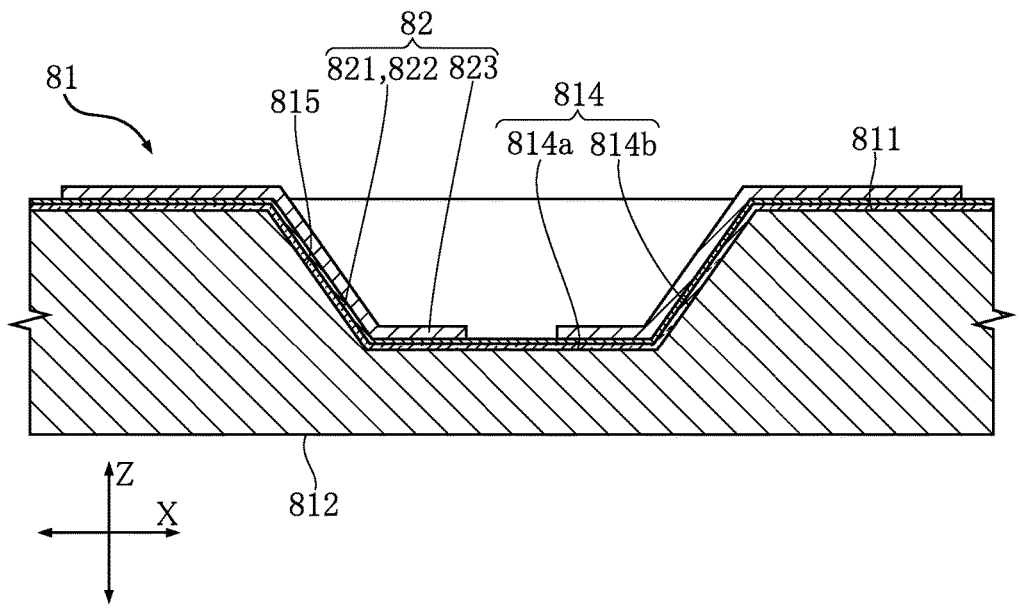
FIG. 14 is a cross-sectional view showing a process in the manufacturing method of the semiconductor device shown in FIG. 1.
Figure 15:
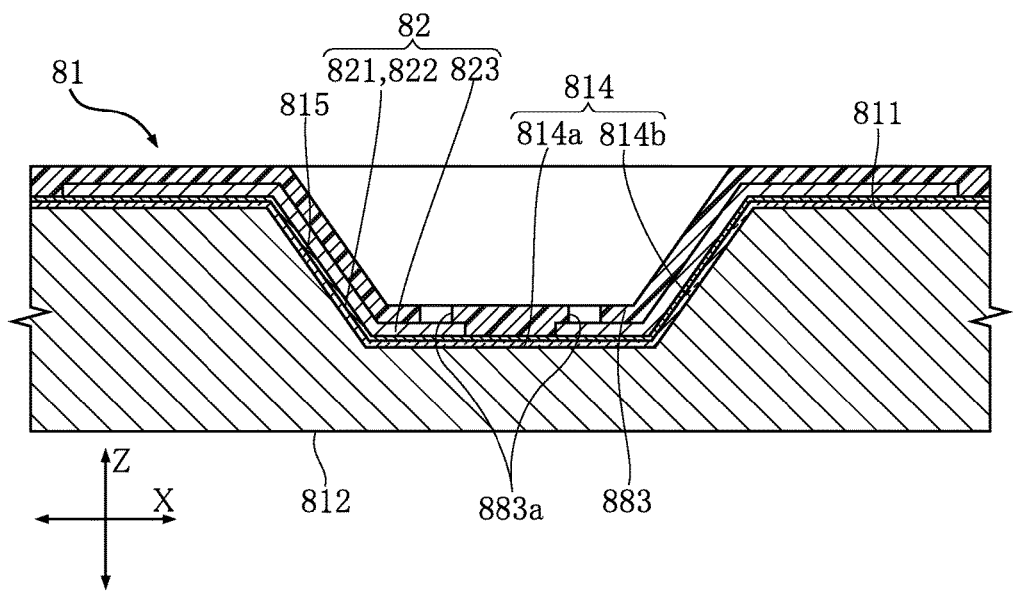
FIG. 15 is a cross-sectional view showing a process in the manufacturing method of the semiconductor device shown in FIG. 1.
Figure 16:
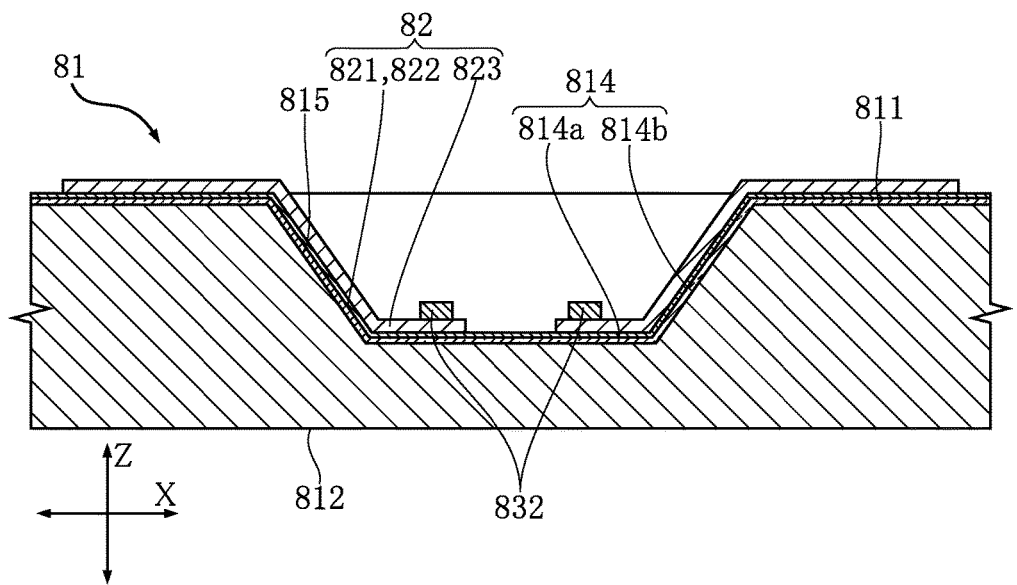
FIG. 16 is a cross-sectional view showing a process in the manufacturing method of the semiconductor device shown in FIG. 1.

Then, referring to FIG. 14, a plated layer 823 is formed on the substrate 81 utilizing the above-mentioned first resist layer 882, and all the layer 882 on the substrate 81 is removed. The plated layer 823 is formed in the region where the seed layer 822 is exposed from the resist layer 882. The plated layer 823 is formed by electrolytic plating. In this embodiment, the plated layer 823 is made of Cu, in a thickness of thickness 3 to 10 μm. Through the mentioned process, the conductive layer 82 is formed on the substrate 81.

Then, a bonding layer 832 for mounting a semiconductor element 831 is formed on the conductive layer 82. The bonding layer 832 corresponds to the bonding layer 32 of the semiconductor device A10. Specifically, referring to FIG. 15, a second resist layer or mask 883 is formed on the conductive layer 82 by photolithography as with the first resist layer 882. First, a base resist layer is formed on the substrate 81 by spraying the same resist material over the required region, and then the base resist layer is exposed to light in predetermined pattern. The light-exposed portions of the base resist layer are removed in the subsequent developing process, so that a plurality of through-holes 883a are formed in the second resist layer 883. In this embodiment, the through-holes 883a are rectangular in plan view.

Then, the bonding layer 832 is formed on the conductive layer 82 utilizing the above-mentioned second resist layer 883, and all the second resist layer 883 is removed. The bonding layer 832 is made up of an Ni layer and a Sn-containing alloy layer stacked on each other, and is electrically conductive. In this embodiment, the bonding layer 832 may be formed by electrolytic plating using the seed layer 822 so as to fill in the above-mentioned through-holes 883a, first depositing the Ni layer on the plated layer 823 exposed via the through-hole 883a and then the Sn-containing alloy layer on the Ni layer. The alloy layer may be a lead-free solder such as an Sn—Sb alloy and an Sn—Ag alloy.

Figure 17:
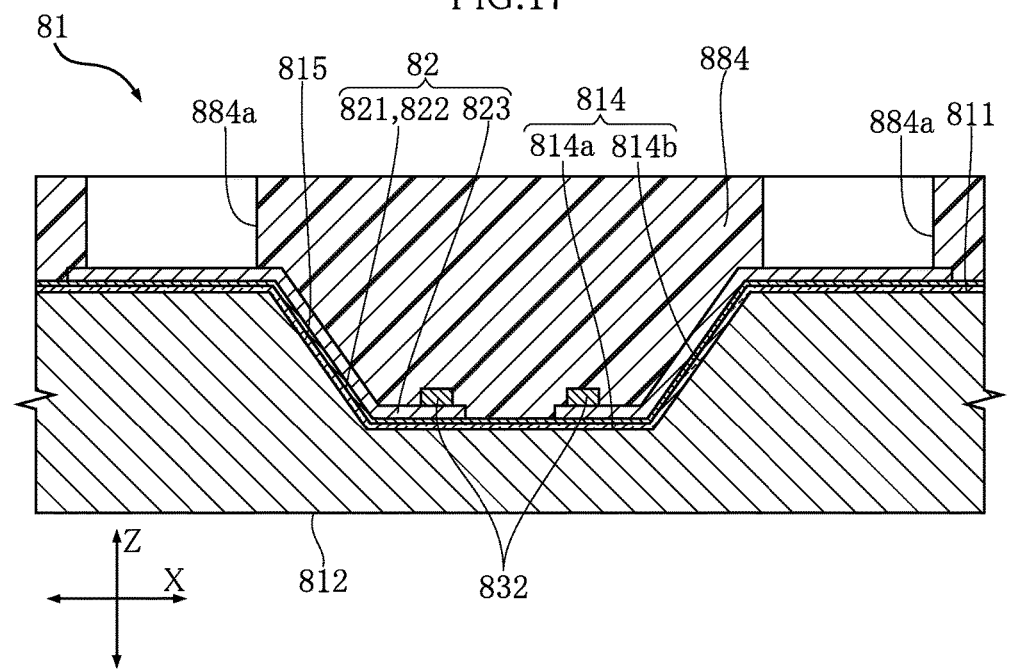
FIG. 17 is a cross-sectional view showing a process in the manufacturing method of the semiconductor device shown in FIG. 1.

Then a plurality of columnar conductors 852 electrically connected to the conductive layer 82 on the main surface 811 are formed. The columnar conductor 852 corresponds to the columnar portion 52 of the semiconductor device A10. Referring to FIG. 17, first, a third resist layer or mask 884 is formed on the conductive layer 82 by photolithography. Specifically, a base resist layer is formed on the substrate 81, covering the conductive layer 82, and then the base resist layer is subjected to light-exposure and subsequent development in the same manner as with the first resist layer 882. By this process, the third resist layer 884 with a plurality of through-holes 884a formed therein are obtained. In this embodiment, the through-holes 884a are circular in plan view.

Figure 18:
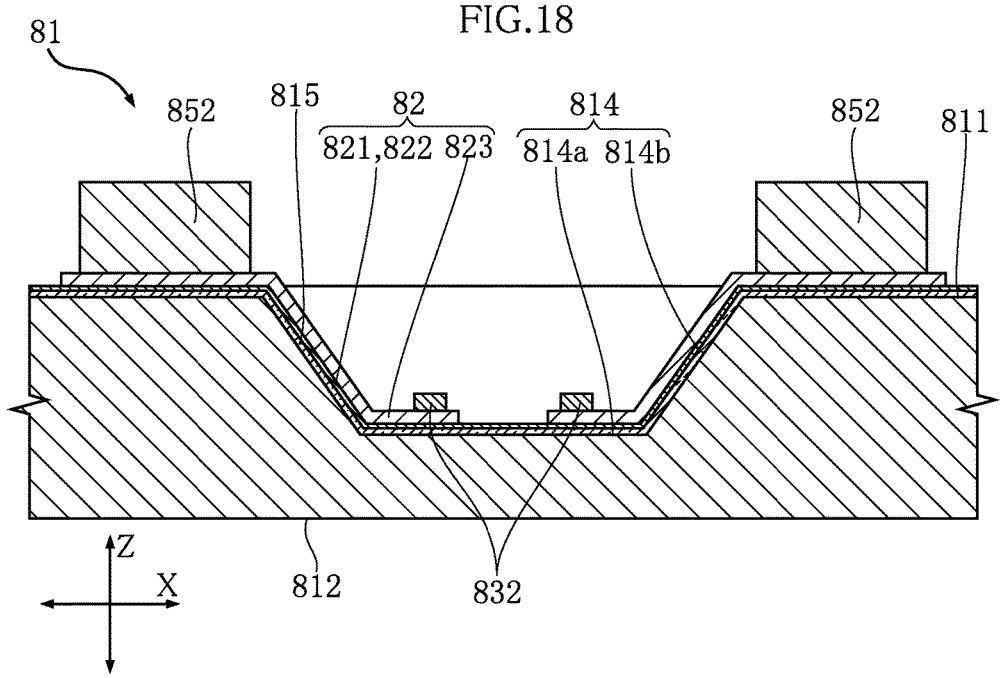
FIG. 18 is a cross-sectional view showing a process in the manufacturing method of the semiconductor device shown in FIG. 1.

As shown in FIG. 18, a plurality of columnar conductors 852 are formed using the third resist layer 884, and then the third resist layer 884 is thoroughly removed. In this embodiment, the plurality of columnar conductors 852 can be formed so as to fill in the through-holes 884a, for example, by depositing Cu on the plated layer 823 exposed in the through-holes 884a by electrolytic plating utilizing the seed layer 822.

Figure 19:
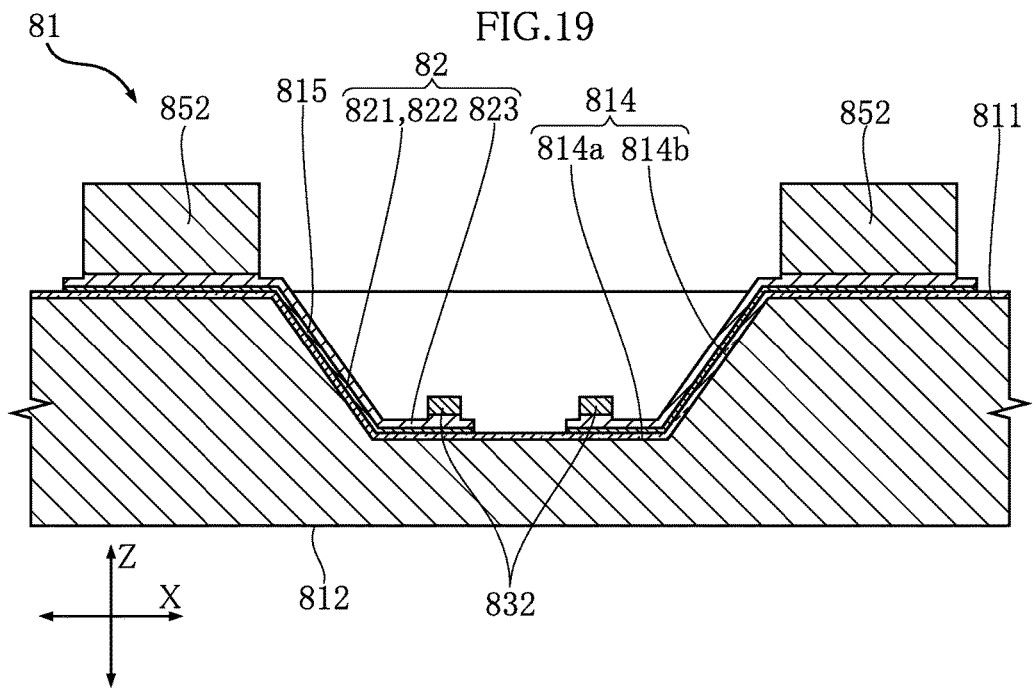
FIG. 19 is a cross-sectional view showing a process in the manufacturing method of the semiconductor device shown in FIG. 1.

As shown in FIG. 19, the barrier layer 821 and the seed layer 822 uncovered with the plated layer 823, which are no longer necessary, are thoroughly removed. The barrier layer 821 and the seed layer 822 may be removed, for example, by wet etching. The insulation layer 815 is exposed in the region where the barrier layer 821 and the seed layer 822 have been removed. In this process, the thickness of the plated layer 823, the bonding layer 832, and the plurality of columnar conductors 852 are reduced by the wet etching by an amount corresponding to the film thickness of the barrier layer 821 and the seed layer 822. In FIGS. 2 to 5 and FIGS. 19 to 22, the stepped portions formed through the above-mentioned process in the plated layer 823 (plated layer 203) adjacent to the bonding layer 832 (bonding layer 32) or the columnar conductors 852 (columnar conductors 52) are illustrated in exaggerated sizes. The same also applies to FIGS. 25 to 28 illustrating a semiconductor device A20, and to FIG. 29 illustrating a semiconductor device A21. The conductive layer 82 obtained through the above-mentioned process corresponds to the conductive layer 20 of the semiconductor device A10.

Figure 20:
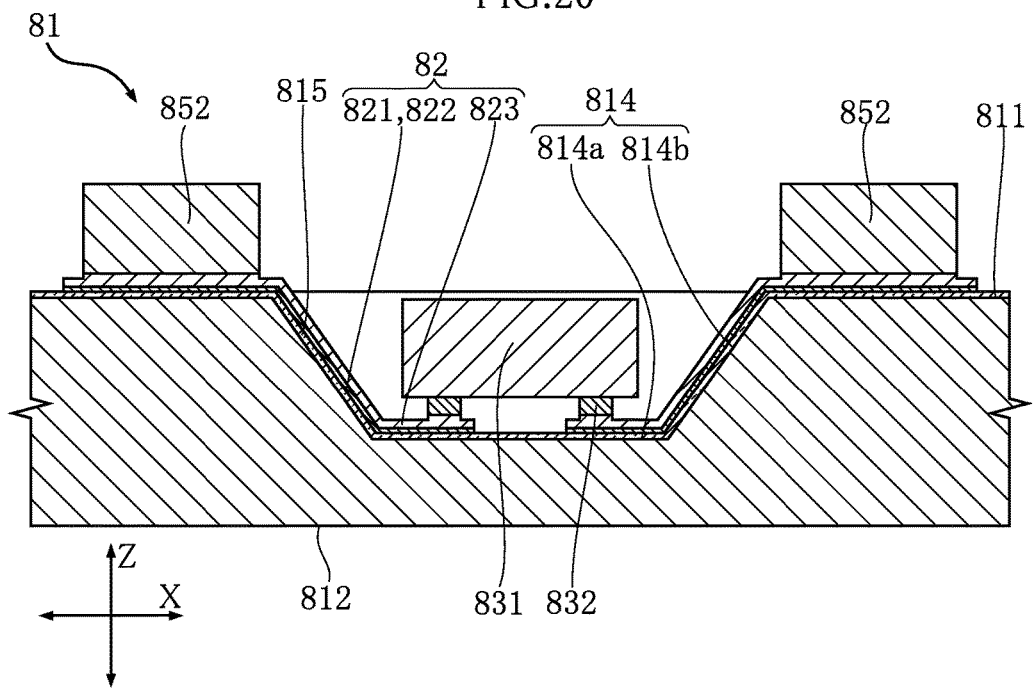
FIG. 20 is a cross-sectional view showing a process in the manufacturing method of the semiconductor device shown in FIG. 1.

As shown in FIG. 20, the semiconductor element 831 is mounted on the bottom surface 814a to be accommodated in the recess 814. The semiconductor element 831 corresponds to the semiconductor element 31 of the semiconductor device A10. The semiconductor element 831 is mounted by flip-chip bonding (FCB). Specifically, a non-illustrated flux is applied to the semiconductor element 831, and the semiconductor element 831 is placed on the bonding layer 832 by a non-illustrated flip-chip bonder, for example. At this stage, the bonding layer 832 is disposed between the conductive layer 82 on the bottom surface 814a and a non-illustrated electrode bump formed on the lower surface of the semiconductor element 831. Then, the bonding layer 832 is melted by reflow soldering, and then cooled to solidify. Thus, the semiconductor element 831 is securely mounted on the bottom surface 814a.

Figure 21:
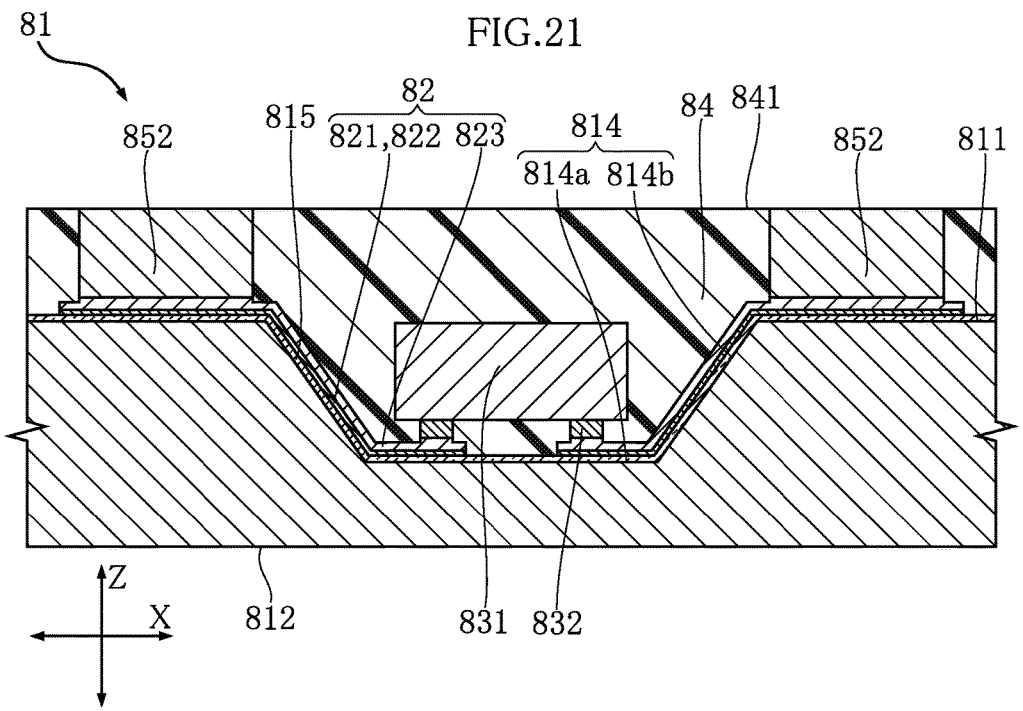
FIG. 21 is a cross-sectional view showing a process in the manufacturing method of the semiconductor device shown in FIG. 1.

As shown in FIG. 21, a sealing resin 84 for covering the semiconductor element 831 is formed on the substrate 81. The sealing resin 84 corresponds to the sealing resin 4 of the semiconductor device A10. The sealing resin 84 is formed so as to fill in the recess 814 formed in the substrate 81 and to completely cover the conductive layer 82, the semiconductor element 831, and the plurality of columnar conductors 852. The sealing resin 84 is, for example, made of an electrically insulative black epoxy resin. The upper portion of the sealing resin 84 is polished until the upper surfaces of the columnar conductors 852 shown in FIG. 21 are exposed. The upper surface or main surface 841 of the sealing resin 84 shown in FIG. 21 is flush with the respective upper surfaces of the columnar conductors 852.

Figure 22:
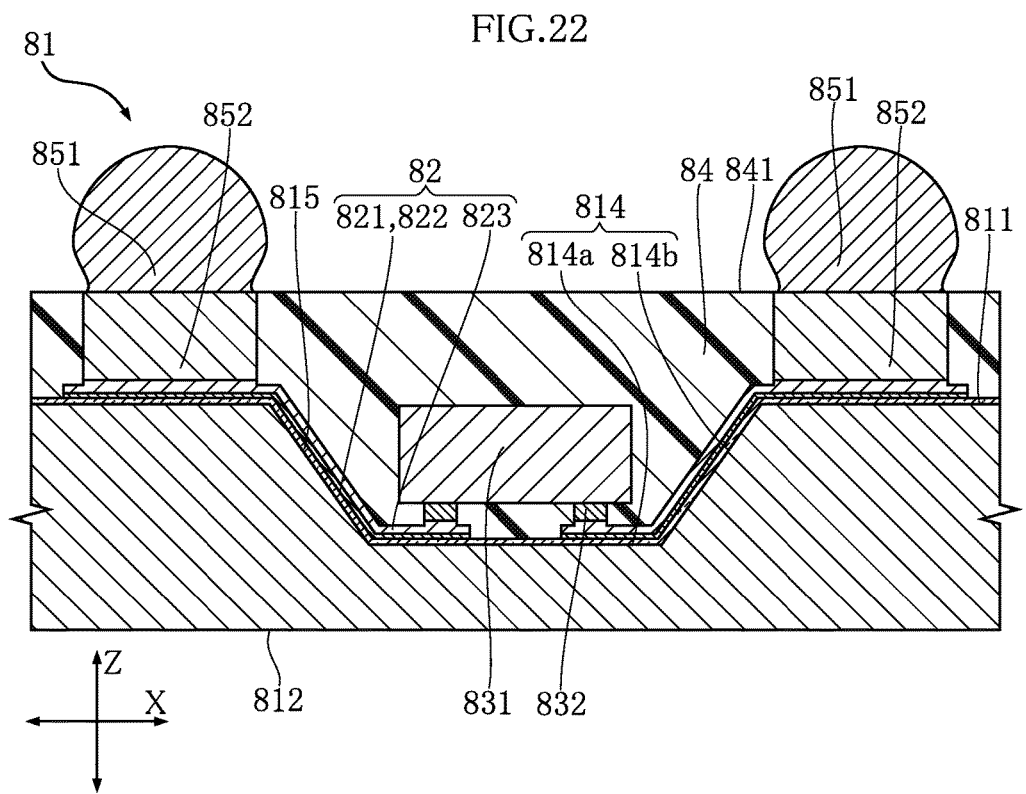
FIG. 22 is a cross-sectional view showing a process in the manufacturing method of the semiconductor device shown in FIG. 1.
Figure 23:
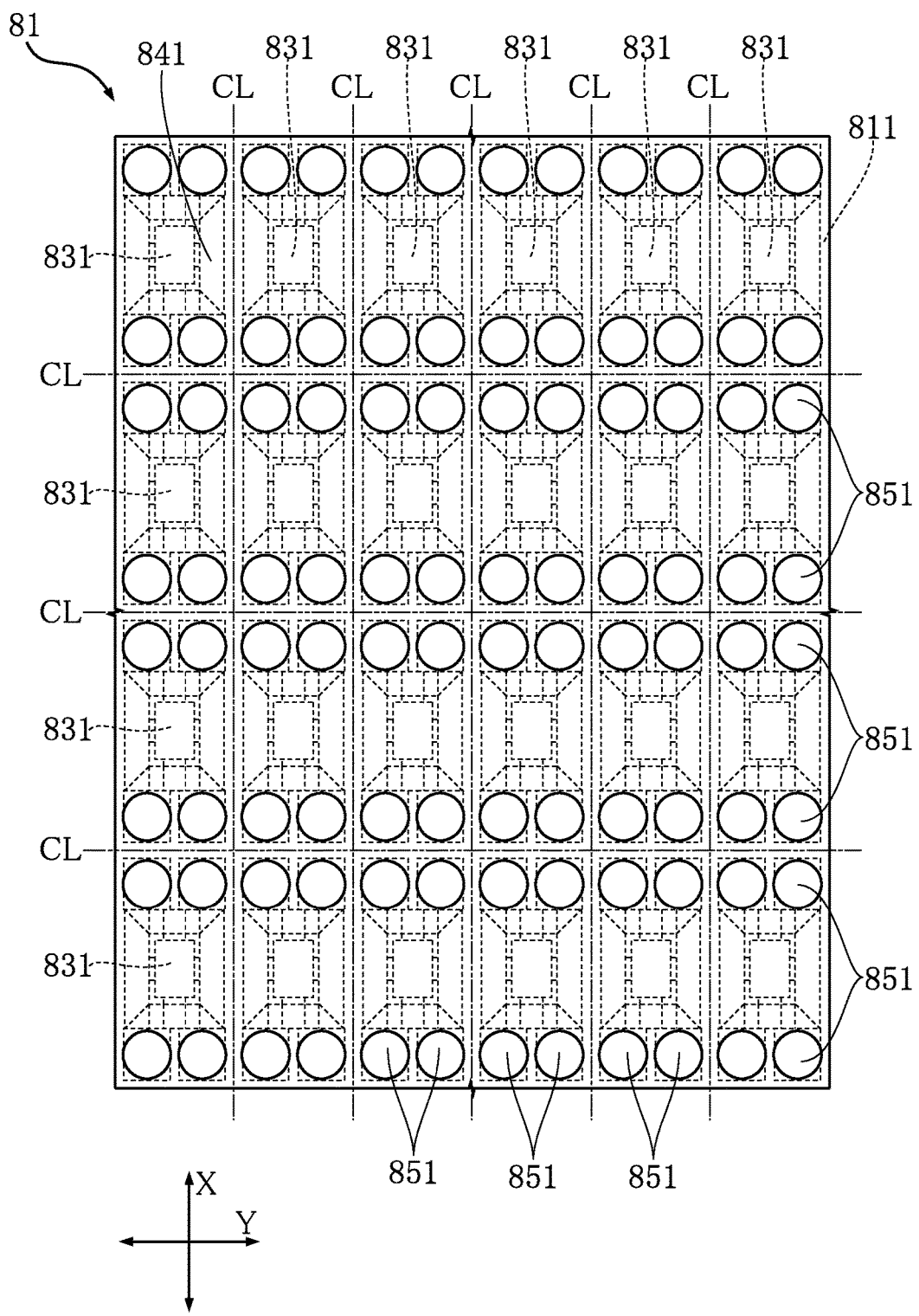
FIG. 23 is a plan view showing a process in the manufacturing method of the semiconductor device shown in FIG. 1.

As shown in FIG. 22, a plurality of spherical conductors 851 are formed in contact with the respective columnar conductors 852. The spherical conductors 851 each correspond to the spherical conductor 51 of the semiconductor device A10. In this embodiment, to form the spherical conductors 851, a plurality of Cu-core solder balls to which a non-illustrated flux is applied are disposed on (tentatively bonded to) the upper surfaces of the respective columnar conductors 852. Then, the Cu-core solder balls are melted by reflow soldering and then cooled to solidify. As a result, the Cu-core solder balls are firmly bonded to the upper surfaces of the respective columnar conductors 852, and the spherical conductors 851 are obtained. At this stage, the height from the main surface 841 to the top of the columnar conductor 852 is 150 to 200 μm. In an embodiment, before placing the Cu-core solder balls on the upper surfaces of the columnar conductors 852, a recess may be formed in the upper surface of each columnar conductor 852 by e.g. wet etching, and the Cu-core solder ball may be placed in engagement with the recess.

As shown in FIG. 23, the substrate 81 is cut (diced) along cutting lines CL drawn in the first direction X and the second direction Y, so as to be divided into individual pieces of semiconductor element 831. The cutting of the substrate 81 may be performed by plasma dicing, for example. The resulting pieces each correspond to a semiconductor device A10.

Advantages of the semiconductor device A10 will be described below.

In the above-noted embodiment, the semiconductor device A10 includes spherical conductors 51 electrically connected to the conductive layer 20 and protruding outward from the resin main surface 41. The spherical conductors 51 serve as external terminals, which are relatively long (or tall) in the thickness direction Z. Accordingly, when the semiconductor device A10 is mounted on a circuit board via the conductors 51, the bottom surface 141, on which the semiconductor element 31 (Hall-effect element) is mounted, is located at a higher position with respect to the circuit board. Accordingly, it is possible to shorten the distance between an external magnet outside the semiconductor device A10 and the magneto-sensitive surface of the Hall-effect element 31, even when the depth of the recess 14 is relatively small. Accordingly, it is possible to prevent the semiconductor device A10 from having an unduly great size, in particular as viewed in plan.

Further, the spherical conductor 51 has a surface layer made of an Sn-containing alloy and an internal portion covered with the surface layer, where the internal portion includes a spherical core made of Cu and an Ni layer covering the core. Accordingly, while the surface layer is melted by the reflow soldering when the semiconductor device A10 is surface-mounted on a circuit board, the core located inside of the surface layer does not melt. Hence, it is possible to secure a desired gap between the resin main surface 41 and the circuit board. Consequently, the desired distance between the magneto-sensitive surface of the Hall-effect element and the external magnet can be maintained, which contributes to preserving the accuracy of magnetic flux detection by the semiconductor device A10.

In addition, the semiconductor device A10 includes columnar conductors 52, and the sealing resin 4 protrudes beyond the main surface 11 due to the presence of the columnar conductors 52. With such a configuration, the sealing resin 4 can entirely cover the semiconductor element 31 even when an upper portion of the semiconductor element 31 is located out of the recess 14, i.e., protrudes beyond the main surface 11 of the substrate 1.

Reference is now made to FIGS. 24 to 29, illustrating other embodiments or variations of the present invention. In these drawings, the elements same as or similar to those of the semiconductor device A10 described above are indicated by the same numerals, and the description thereof may be omitted.

Second Embodiment

Figure 24:
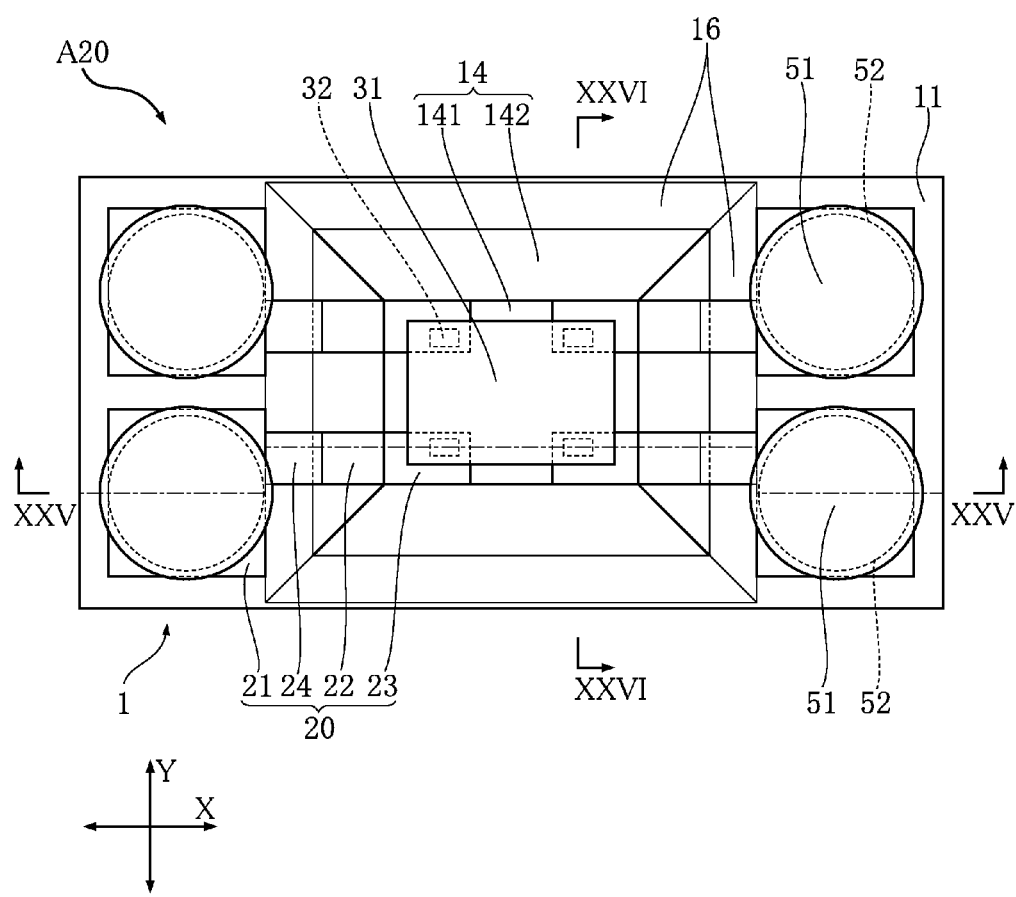
FIG. 24 is a plan view showing a part of a semiconductor device according to a second embodiment of the present invention.
Figure 25:
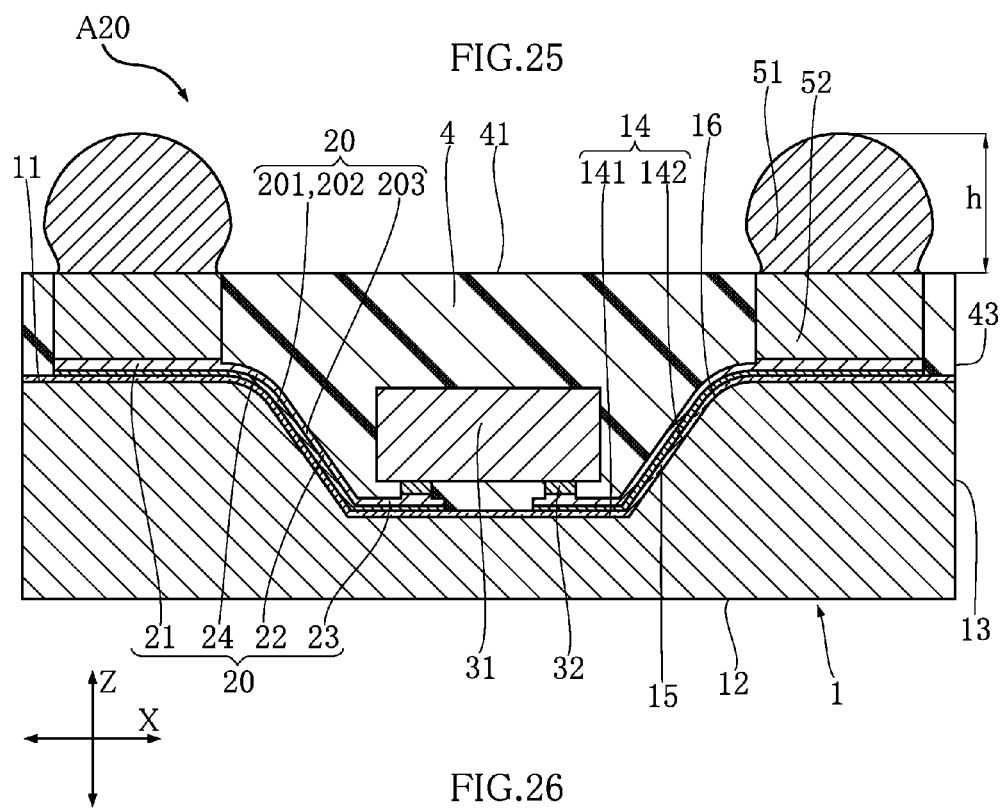
FIG. 25 is a cross-sectional view taken along a line XXV-XXV in FIG. 24.
Figure 26:
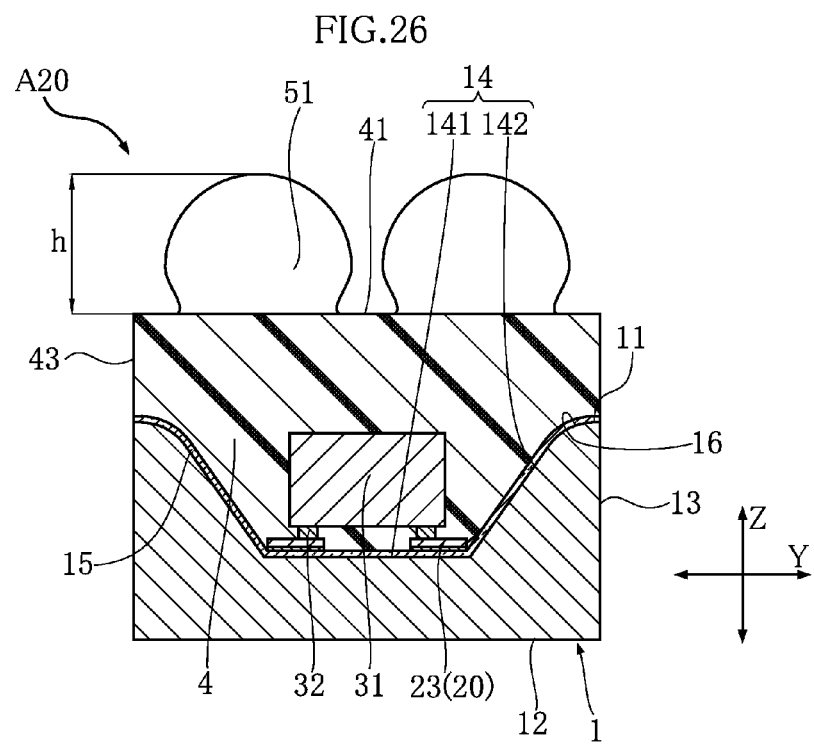
FIG. 26 is a cross-sectional view taken along a line XXVI-XXVI in FIG. 24.
Figure 27:
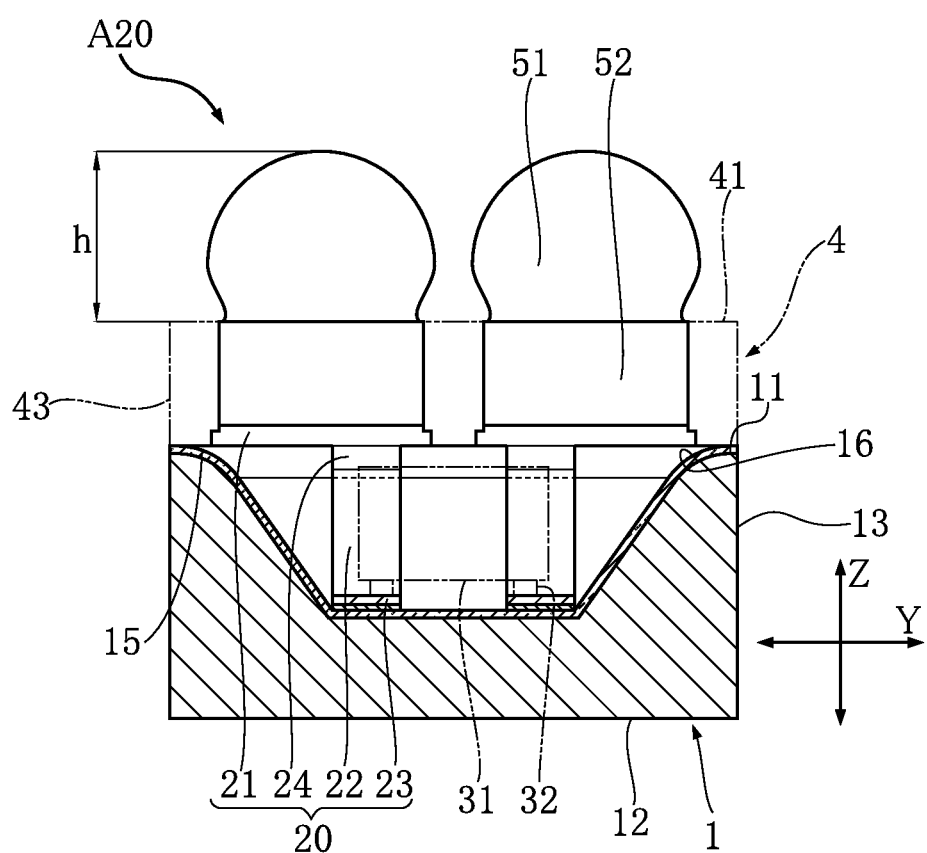
FIG. 27 is a cross-sectional view corresponding to FIG. 26.
Figure 28:
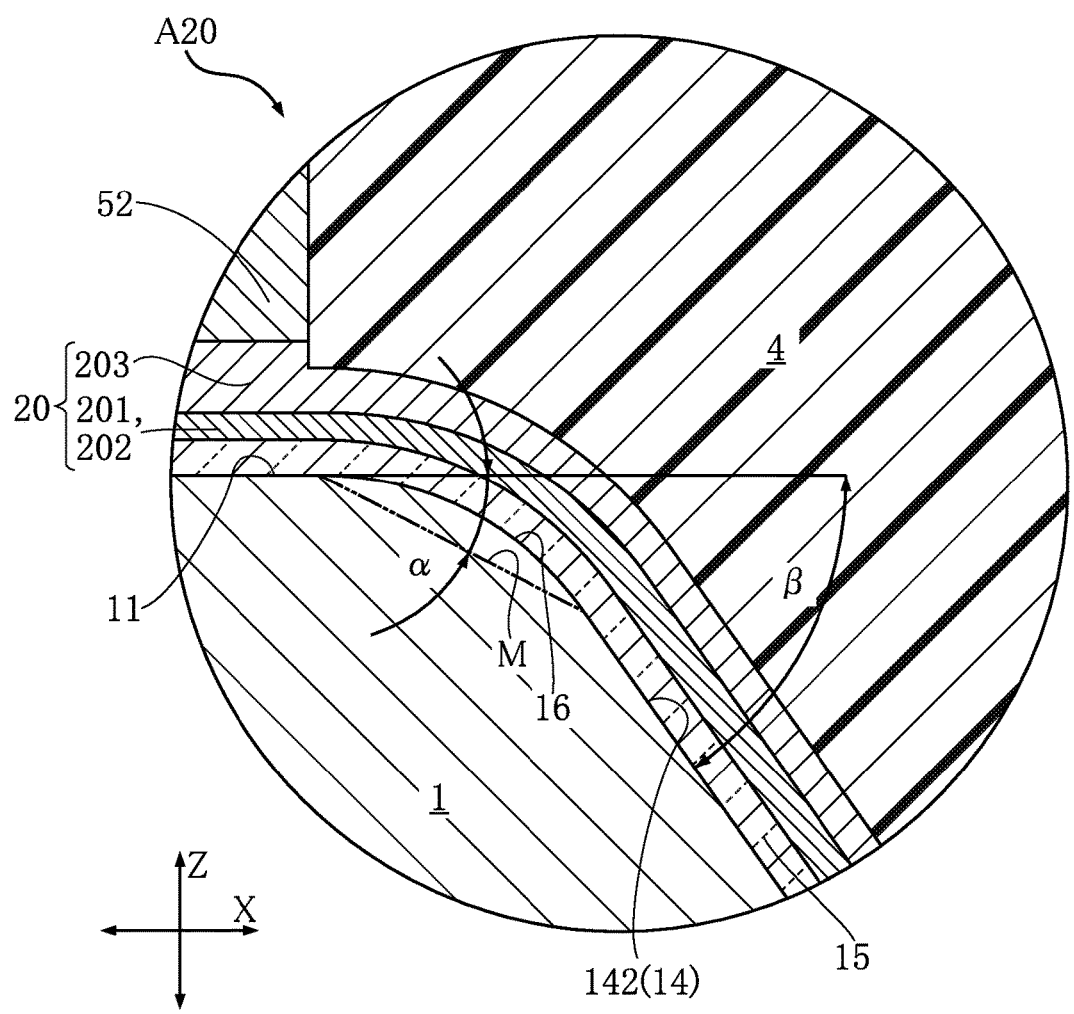
FIG. 28 is an enlarged fragmentary cross-sectional view of a portion in FIG. 25.
Figure 29:
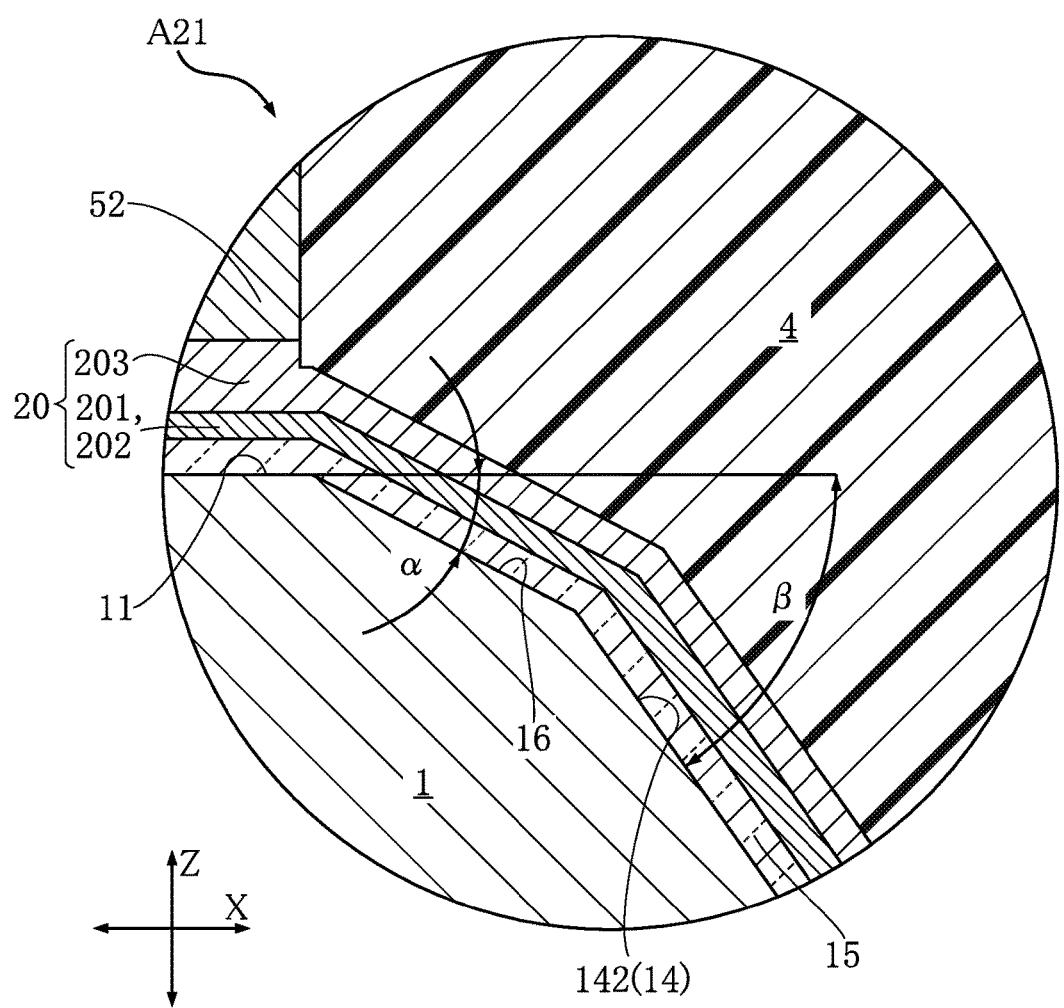
FIG. 29 is a cross-sectional view corresponding to FIG. 28, showing a semiconductor device according to a variation of the second embodiment of the present invention.

FIGS. 24-28 illustrate a semiconductor device A20 according to a second embodiment of the present invention. FIG. 24 is a plan view showing a part of the semiconductor device A20. For clarity, the insulation layer 15 and the sealing resin 4 are omitted from FIG. 24. FIG. 25 is a cross-sectional view taken along a line XXV-XXV (chain line) in FIG. 24. FIG. 26 is a cross-sectional view taken along a line XXVI-XXVI in FIG. 24. FIG. 27 is a cross-sectional view (corresponding to FIG. 26) in which the semiconductor element 31, the bonding layer 32, and the sealing resin 4 are indicated by double-dot chain lines. FIG. 28 is an enlarged fragmentary cross-sectional view of a portion in FIG. 25. In this embodiment, the semiconductor device A20 has a rectangular shape in plan view.

The semiconductor device A20 of the second embodiment is different from the semiconductor device A10 described above in the configuration of the substrate 1 and the conductive layer 20.

In the second embodiment, the substrate 1 has a connection surface 16 formed between the main surface 11 and the intermediate surface 142. As shown in FIG. 25 and FIG. 26, the lower end of the connection surface 16 is connected to the upper end of the intermediate surface 142, and the upper end of the connection surface 16 is connected to the main surface 11 in the thickness direction Z of the substrate 1. Accordingly, as is seen from FIG. 24, the connection surface 16 includes a plurality of (four) connection surfaces. The connection surfaces 16 are formed along the four sides of the main surface 11. Each connection surface 16 is inclined with respect to the bottom surface 141.

As shown in FIG. 28, in the second embodiment, the connection surfaces 16 are curved. In the figure, the angle defined by the main surface 11 and each connection surface 16 is indicated by $\alpha$, which is an acute angle formed between the main surface 11 and an imaginary "average sloped surface" M (formed by connecting the upper and lower ends of the connection surface 16 by a straight line). Likewise, another acute angle $\beta$ is shown in the figure, which is formed between the main surface 11 and the intermediate surface 142. In the second embodiment, the angle $\alpha$ is smaller than the angle $\beta$ (i.e., $\alpha<\beta$).

The connection surface 16 may be formed for example through the following process, after the recess 814 is formed in the substrate 81 (FIG. 9). First, a mask layer made of $Si_3N_4$ (different from the mask layer 881 shown in FIG. 6) is formed over the main surface 811 and the recess 814 through a plasma CVD process. Then, a further mask of a required pattern is formed over the mask layer by photolithography. Then, a portion of the mask layer exposed from the further mask (the exposed portion corresponding in location to a joint between the main surface 811 and the intermediate surface 814b) is removed by reactive ion etching utilizing $CF_4$ as etching gas. As a result, an opening (not shown) of a frame shape in plan view is formed along the intermediate surface 814b in the mask layer for each recess 814, and the joint portion is exposed from the opening. Then, the joint portion is chamfered by reactive ion etching utilizing $SF_6$ as etching gas. Finally, the mask layer on the main surface 811 and the recess 814 is thoroughly removed by reactive ion etching utilizing $CF_4$ as etching gas, or wet etching utilizing heated solution of phosphoric acid.

In the second embodiment, the conductive layer 20 further includes connection conductive portions 24 formed on the connection surface 16. As shown in FIG. 24 and FIG. 27, each connection conductive portion 24 is a strip-shaped portion in plan view, formed on one of the two connection surfaces 16 spaced apart from each other in the first direction X. The connection conductive portions 24 are parallel to the first direction X. As shown in FIG. 25, the lower ends of the respective connection conductive portions 24 are connected to the intermediate surface conductive portions 22 and the upper ends of the respective connection conductive portions 24 are connected to the main surface conductive portions 21.

The connection conductive portions 24 include a barrier layer 201, a seed layer 202 and a plated layer 203, like the other portions of the conductive layer 20 (namely the main surface conductive portion 21, the intermediate surface conductive portion 22 and the bottom surface conductive portion 23). The above-mentioned barrier layer 201, seed layer 202 and plated layer 203 have respective thicknesses equal to those of the other portions of the conductive layer 20.

With the configuration of the second embodiment, the sensitivity of the Hall-effect element can also be improved without incurring an increase in size of the semiconductor device A20. In addition, the substrate 1 of the second embodiment additionally includes the connection surfaces 16 formed between the main surface 11 and the intermediate surface 142, as shown in FIG. 24, FIG. 25, and FIG. 26. Also, as illustrated in FIG. 28, the angle ($\alpha$) defined by the main surface 11 and the connection surface 16 is smaller than the angle ($\beta$) defined by the main surface 11 and the intermediate surface 142. This configuration enables the portion of the plated layer 823 corresponding to the joint portion between the main surface 811 and the intermediate surface 814b to be formed in the same thickness as the portions of the plated layer 823 in other regions of the substrate 81, in the formation process of the plated layer 823 shown in FIG. 14 in the manufacturing process of the semiconductor device A20. This is because when the first resist layer 882 is applied to the joint portion to form the plated layer 823, the first resist layer 882 is prevented from being formed in a reduced thickness compared with the other portions. Thus, the plated layer 203 of the semiconductor device A20 can be formed in a uniform thickness over the entirety thereof.

Variation of Second Embodiment

Reference is made to FIG. 29 illustrating a semiconductor device A21 according to a variation of the second embodiment of the present invention. FIG. 29 is an enlarged fragmentary cross-sectional view of the semiconductor device A21. The cross-sectional portion shown in FIG. 29 corresponds to that of FIG. 28, which is an enlarged fragmentary cross-sectional view of the semiconductor device A20.

The semiconductor device A21 is different from the semiconductor device A20 in the shape of the connection surfaces 16. As shown in FIG. 29, each connection surface 16 is a flat surface. The angle defined by the main surface 11 and the connection surface 16 is an acute angle $\alpha$. The angle $\beta$ defined by the main surface 11 and the intermediate surface 142 is the same as that of the semiconductor device A20. In this variation also, the angle $\alpha$ is smaller than the angle $\beta$.

The above variation can also provide the same advantages as those provided by the semiconductor device A20.

The semiconductor devices according to the present invention are not limited to the foregoing embodiments. The specific configurations of each portion of a semiconductor device of the present invention may be modified in various manners.

The invention claimed is:
1. A semiconductor device comprising:
a semiconductor element;
a semiconductor substrate including a substrate main surface and a recess that recedes from the substrate main surface and houses the semiconductor element;
a conductive layer electrically connected to the semiconductor element and formed on the semiconductor substrate;
an opaque sealing resin covering the semiconductor element and including a resin main surface that faces in a same direction as the substrate main surface; and
spherical conductors electrically connected to the conductive layer and protruding outward from the resin main surface,
wherein the recess includes a bottom surface on which the semiconductor element is mounted and at least one intermediate surface connected to the bottom surface and the substrate main surface, the bottom surface being orthogonal to a thickness direction of the semiconductor substrate, and the intermediate surface being inclined with respect to the bottom surface,
wherein the semiconductor substrate includes a connection surface disposed between the substrate main surface and the intermediate surface,
wherein the connection surface is flat, and
wherein the opaque sealing resin overlaps with the connection surface in a plan view.

2. The semiconductor device according to claim 1, wherein each of the spherical conductors has a surface layer made of an alloy containing Sn.

3. The semiconductor device according to claim 2, wherein each of the spherical conductors has an internal portion covered with the surface layer, the internal portion including a spherical core made of Cu and an Ni layer covering the core.

4. The semiconductor device according to claim 1, wherein a height from the resin main surface to a top of each of the spherical conductors is 150 to 200 µm.

5. The semiconductor device according to claim 1, wherein the at least one intermediate surface comprises a plurality of intermediate surfaces, the bottom surface has a shape of rectangle in plan view, and the plurality of intermediate surfaces are arranged along four sides of the bottom surface.

6. The semiconductor device according to claim 5, wherein the plurality of intermediate surfaces are inclined at a same angle with respect to the bottom surface.

7. The semiconductor device according to claim 1, wherein an angle formed between the connection surface and the substrate main surface is smaller than an angle formed between the substrate main surface and the intermediate surface.

8. The semiconductor device according to claim 1, wherein the semiconductor substrate is made of a monocrystalline semiconductor material.

9. The semiconductor device according to claim 8, wherein the semiconductor material is Si.

10. The semiconductor device according to claim 9, wherein the substrate main surface constitutes a (100) surface.

11. The semiconductor device according to claim 1, wherein the semiconductor element is a Hall-effect element.

12. The semiconductor device according to claim 1, further comprising an insulation layer disposed between the semiconductor substrate and the conductive layer, wherein the insulation layer has a portion formed in recess.

13. The semiconductor device according to claim 12, wherein the insulation layer is made of $SiO_2$.

14. The semiconductor device according to claim 12, wherein the conductive layer includes a barrier layer, a seed layer, and a plated layer stacked on each other, and the barrier layer is closer to the semiconductor substrate than are the seed layer and the plated layer, the seed layer being disposed between the barrier layer and the plated layer.

15. The semiconductor device according to claim 14, wherein the barrier layer is made of Ti.

16. The semiconductor device according to claim 14, wherein the plated layer is greater in thickness than the seed layer.

17. The semiconductor device according to claim 16, wherein the seed layer and the plated layer are made of Cu.

18. The semiconductor device according to claim 1, further comprising a columnar conductor having a first end, a second end and a side face, wherein the first end is in contact with a portion of the conductive layer that is formed on the substrate main surface, the second end is in contact with one of the spherical conductors, and the side face is covered with the opaque sealing resin.

19. The semiconductor device according to claim 18, wherein the columnar conductor is made of Cu.

20. The semiconductor device according to claim 1, wherein the semiconductor element is mounted on a portion of the conductive layer that is formed on a bottom surface of the recess, and the semiconductor element is provided with a bonding layer disposed between the semiconductor element and the conductive layer.

21. The semiconductor device according to claim 20, wherein the bonding layer includes an Ni layer and an Sn-containing alloy layer stacked on each other.

22. The semiconductor device according to claim 1, wherein the connection surface is smaller in length in a cross-sectional view taken along a plane parallel to the thickness direction of the semiconductor substrate than one of the at least one intermediate surface.

* * * * *